United States Patent
Friedman et al.

(10) Patent No.: US 11,942,129 B2
(45) Date of Patent: Mar. 26, 2024

(54) TOGGLE SPIN-ORBIT TORQUE MRAM WITH PERPENDICULAR MAGNETIC ANISOTROPY

(71) Applicant: Board of Regents, The University of Texas System, Austin, TX (US)

(72) Inventors: Joseph S. Friedman, Dallas, TX (US); Naimul Hassan, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 211 days.

(21) Appl. No.: 17/594,723

(22) PCT Filed: Apr. 30, 2020

(86) PCT No.: PCT/US2020/030808
§ 371 (c)(1),
(2) Date: Oct. 27, 2021

(87) PCT Pub. No.: WO2020/223532
PCT Pub. Date: Nov. 5, 2020

(65) Prior Publication Data
US 2022/0208242 A1    Jun. 30, 2022

Related U.S. Application Data

(60) Provisional application No. 62/840,924, filed on Apr. 30, 2019.

(51) Int. Cl.
*G11C 11/16*    (2006.01)
*H10B 61/00*    (2023.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1673; G11C 11/1675; G11C 11/1659; G11C 11/1693;
(Continued)

(56) References Cited

U.S. PATENT DOCUMENTS 8,213,222 B2    7/2012    Zheng et al.
8,363,460 B2 *  1/2013    Abedifard ........... G11C 11/1675
                                                    365/158

(Continued)

FOREIGN PATENT DOCUMENTS

WO    2020223532 A1    11/2020

OTHER PUBLICATIONS

Legrand et al., "Coherent Sub-Nanosecond Switching of Perpendicular Magnetization by the Field-like Spin-Orbit Torque without an External Magnetic Field," Physical Review Applied 3(6), 2015, 30 pages.
(Continued)

*Primary Examiner* — Fernando Hidalgo
(74) *Attorney, Agent, or Firm* — Yee & Associates, P.C.

(57) ABSTRACT

A magnetic tunnel junction is provided. The magnetic tunnel junction comprises an insulating tunnel barrier and a fixed ferromagnet layer adjacent the tunnel barrier. The fixed ferromagnet comprises a fixed magnetization along an easy axis approximately normal to an interface between the fixed ferromagnet and the tunnel barrier. A free ferromagnet layer is adjacent the tunnel barrier on the side opposite the fixed ferromagnet. The free ferromagnet layer comprises a bistable magnetization along the easy axis that can switch between a parallel state and an anti-parallel state with the fixed ferromagnet. A heavy metal layer is adjacent the free ferromagnet on the side opposite the tunnel barrier. A unidirectional electric current pulse through the heavy metal layer switches the bistable magnetization of the free ferromagnet, thereby switching an electrical resistance state of the magnetic tunnel junction.

20 Claims, 21 Drawing Sheets

(51) Int. Cl.
    *H10N 50/10*    (2023.01)
    *H10N 50/80*    (2023.01)
(52) U.S. Cl.
    CPC ............. *H10B 61/00* (2023.02); *H10N 50/10* (2023.02); *H10N 50/80* (2023.02)
(58) Field of Classification Search
    CPC ........ H10B 61/00; H10N 50/10; H10N 50/80; H01F 10/3254; H01F 10/3286; H01F 10/329
    USPC ........................................................ 365/158
    See application file for complete search history.

(56) References Cited

U.S. PATENT DOCUMENTS

| | | | |
|---|---|---|---|
| 9,589,619 B2* | 3/2017 | Lee | .................. H10N 50/10 |
| 9,997,226 B2 | 6/2018 | Qiu et al. | |
| 2014/0347918 A1* | 11/2014 | Lee | .................. G11C 11/00 |
| | | | 365/158 |
| 2016/0155485 A1* | 6/2016 | Dieny | .................. G11C 11/165 |
| | | | 365/158 |
| 2018/0240966 A1* | 8/2018 | Mihajlovic | ............ H10B 61/22 |
| 2019/0058112 A1 | 2/2019 | Chen et al. | |
| 2019/0058113 A1 | 2/2019 | Ramaswamy et al. | |
| 2019/0244646 A1 | 8/2019 | Lee et al. | |
| 2020/0043538 A1 | 2/2020 | Mihajlovic et al. | |

OTHER PUBLICATIONS

Pathak et al., "Impact of Spin-Orbit Torque on Spin-Transfer Torque Switching in Magnetic Tunnel Junctions," Scientific Reports, 2020, 8 pages.
Lee et al., "Oscillatory spin-orbit torque switching induced by field-like torques," Communications Physics, 2018, 7 pages.
PCT International Search Report and Written Opinion, dated Jul. 27, 2020, regarding Application No. PCT/US20/30808, 8 pages.

* cited by examiner

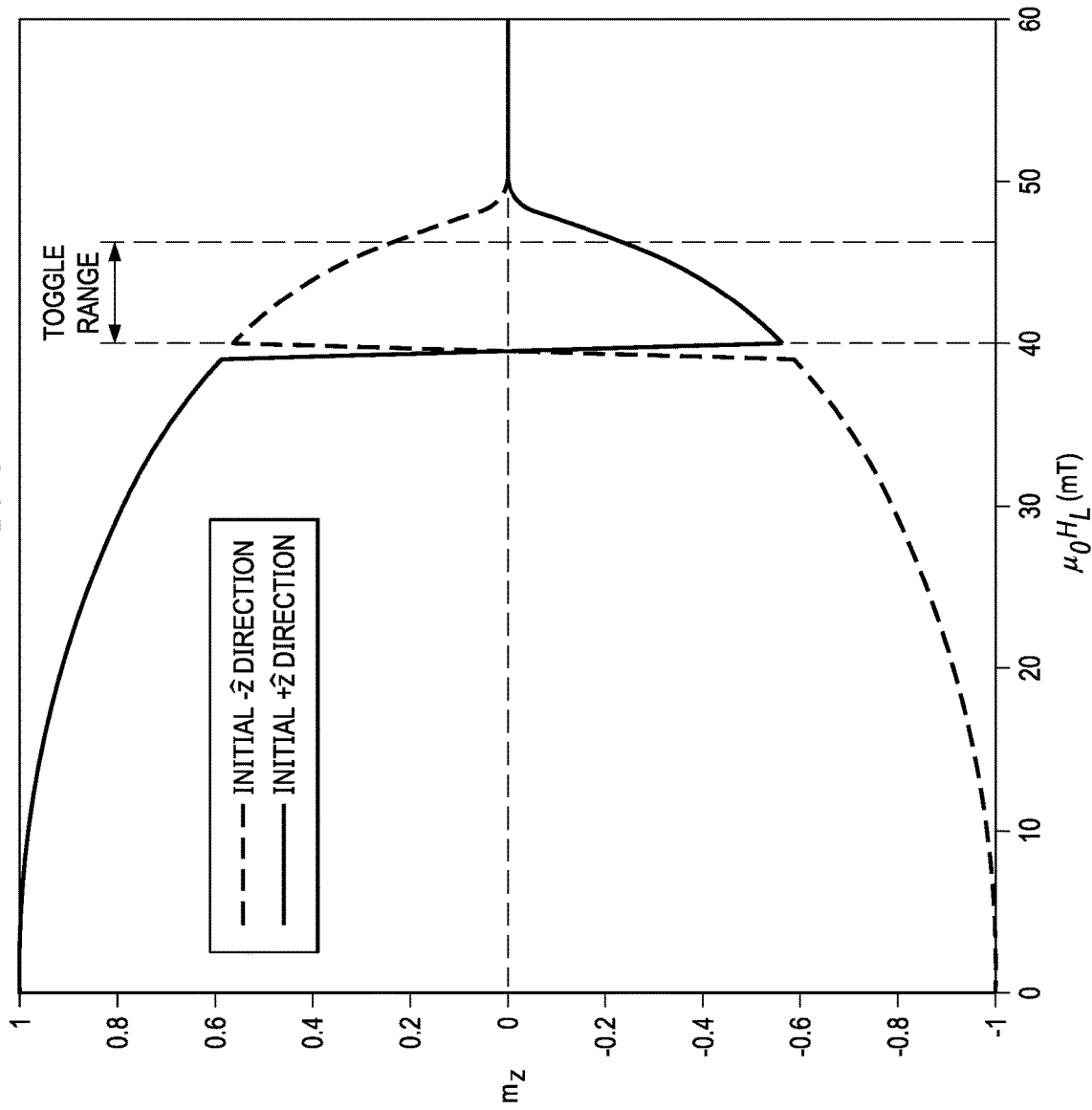

TOGGLE SPIN-ORBIT TORQUE MRAM WITH PERPENDICULAR MAGNETIC ANISOTROPY

RELATED APPLICATIONS

This application claims priority to U.S. Provisional Application 62/840,924, filed Apr. 30, 2019, and PCT Application PCT/US20/30808, filed Apr. 30, 2020 the entirety of which is hereby incorporated by reference.

BACKGROUND INFORMATION

Field

The present invention relates in general to a novel device for magnetic random access memory based on spin-orbit torque switching.

Background

Magnetic random-access memory (MRAM) is a promising candidate for next generation data storage due to its non-volatility, high speed, and energy efficiency. The core of each MRAM bit cell is composed of a magnetic tunnel junction (MTJ) that can be switched between two resistance states. This MTJ is accompanied by complementary circuitry to read and write the magnetic state. Following the development of MRAM switching driven by a magnetic field, spin-transfer torque (STT)-MRAM has become pre-eminent due to its increased density and energy efficiency. In particular, STT-MRAM with perpendicular magnetic anisotropy (PMA) is preferred over in-plane anisotropy due to its higher density and increased thermal stability, which results in a longer data retention time. However, STT-MRAM has several limitations resulting from sharing the read and write path, including degradation of the tunnel barrier from repeated switching.

Spin-orbit torque (SOT) switching has recently been developed in order to overcome the limitations of STT by decoupling the write current path from the MTJ tunnel barrier. However, SOT produces a spin current polarized in the in-plane direction, which cannot switch an MTJ with PMA through conventional approaches.

Several approaches have recently been developed to break the SOT symmetry, thereby enabling SOT-MRAM with PMA. Unfortunately, all of these approaches increase the fabrication complexity, are highly sensitive to the switching current duration and magnitude or increase the switching energy.

SUMMARY

An embodiment of the present disclosure provides a magnetic tunnel junction. The magnetic tunnel junction comprises an insulating tunnel barrier and a fixed ferromagnet layer adjacent the tunnel barrier. The fixed ferromagnet comprises a fixed magnetization along an easy axis approximately normal to an interface between the fixed ferromagnet and the tunnel barrier. A free ferromagnet layer is adjacent the tunnel barrier on the side opposite the fixed ferromagnet. The free ferromagnet layer comprises a bistable magnetization along the easy axis that can switch between a parallel state and an anti-parallel state with the fixed ferromagnet. A heavy metal layer is adjacent the free ferromagnet on the side opposite the tunnel barrier. A unidirectional electric current pulse through the heavy metal layer switches the bistable magnetization of the free ferromagnet, thereby switching an electrical resistance state of the magnetic tunnel junction.

Another embodiment provides a memory device. The memory device includes a magnetic tunnel junction, comprising a fixed ferromagnet with a fixed magnetization, a free ferromagnet with a bistable magnetization, an insulating tunnel barrier between the fixed ferromagnet and free ferromagnet, and a heavy metal layer adjacent the free ferromagnet. A first write terminal and second write terminal are connected to the heavy metal layer. A read terminal is connected to the fixed ferromagnet. The magnetic tunnel junction comprises perpendicular magnetic anisotropy (PMA) along an axis normal to an interface between the free ferromagnet and the insulating tunnel barrier. A unidirectional electric current pulse between the first and second write terminals switches the bistable magnetization of the free ferromagnet.

Another embodiment provides a method of toggle switching a magnetic tunnel junction that comprises a fixed ferromagnet layer, a free ferromagnet layer, an insulating tunnel barrier between the fixed ferromagnet layer and free ferromagnet layer, and a heavy metal layer adjacent the free ferromagnet layer. The method comprises applying a unidirectional electric current pulse between a first write terminal and a second write terminal connected to different sections of the heavy metal layer. The fixed ferromagnet layer comprises a fixed magnetization along an easy axis approximately normal to an interface between the fixed ferromagnet layer and the insulating tunnel barrier, and the free ferromagnet layer comprises a bistable magnetization along the easy axis that can switch between a parallel state and an anti-parallel state with the magnetization of the fixed ferromagnet layer. The unidirectional electric current pulse toggles the bistable magnetization between the parallel and anti-parallel state, thereby switching an electrical resistance state of the magnetic tunnel junction.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 8A shows the stable excited state magnetization as a function of damping-like a SOT field in accordance with an illustrative embodiment;

DETAILED DESCRIPTION

Spin-orbit torque (SOT) is a promising switching mechanism for magnetic random access memory (MRAM) as a result of the potential for improved switching speed and energy efficiency. It is of particular interest to develop a SOT-MRAM device with perpendicular magnetic anisotropy (PMA) in order to leverage the greater density and thermal stability achievable with PMA as opposed to in-plane magnetic anisotropy. However, the orthogonality between SOT and PMA prevents deterministic directional switching without an additional device component that breaks the symmetry, such as an external magnetic field or complex physical structure; not only do these components complicate fabrication, they also are not robust to variations in fabrication and applied switching current.

Figure 1:
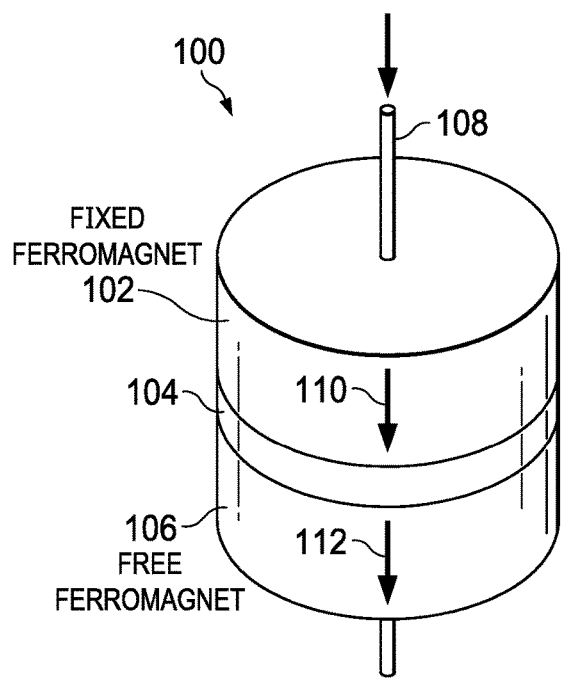
FIG. 1 illustrates a spin-transfer torque MRAM in accordance with the prior art.

FIG. 1 illustrates a spin-transfer torque (STT) MRAM in accordance with the prior art. In the present example, STT MRAM 100 comprises a fixed ferromagnet 102 and a free ferromagnet 106, separated by insulating tunnel barrier 104. Fixed ferromagnet 102 and free ferromagnet 106 have perpendicular magnetic anisotropy (PMA) as indicated by arrows 110 and 112.

Following the development of MRAM switching driven by a magnetic field, STT-MRAM has become preeminent due to its increased density and energy efficiency. In particular, STT-MRAM with PMA is preferred over in-plane anisotropy due to its higher density and increased thermal stability, which results in a longer data retention time. However, STT-MRAM 100 has several limitations including degradation of the tunnel barrier 104 from repeated switching resulting from a shared read and write path 108 by carrying parallel and antiparallel state-inducing write currents.

Figure 2:
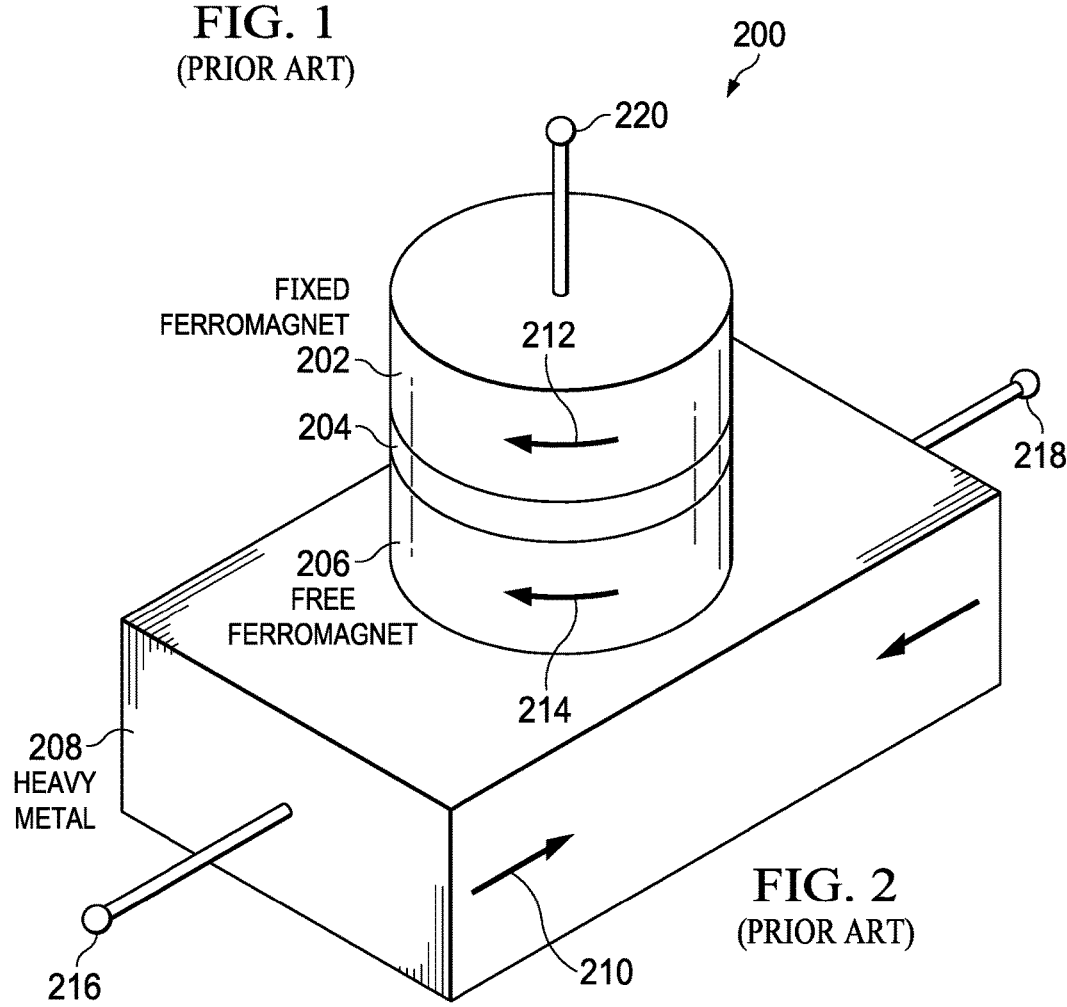
FIG. 2 illustrates a spin-orbit torque MRAM in accordance with the prior art.

FIG. 2 illustrates a spin-orbit torque (SOT) MRAM in accordance with the prior art. SOT MRAM 200 also comprises a fixed ferromagnet 202 and a free ferromagnet 206, separated by insulating tunnel barrier 204. However, SOT MRAM 200 separates the read path (terminal 216 to terminal 218) from the write path (terminal 216 to terminal 218). Adjacent the free ferromagnet 206 is heavy metal layer 208 through which a bidirectional write current 210 passes. The current 210 creates magnetic torque that switches the magnetization of free ferromagnet 206. As shown in FIG. 2, the magnetizations of fixed ferromagnet 202 and free ferromagnet 206 have in-plane magnetization indicated by arrows 212 and 214, rather than PMA as in FIG. 1.

SOT switching has recently been developed in order to overcome the limitations of STT by decoupling the write current path from the MTJ tunnel barrier. However, SOT 200 produces a spin current polarized in the in-plane direction indicated by arrow 210, which cannot switch an MTJ with PMA.

Several approaches have recently been developed to break the SOT symmetry, thereby enabling SOT-MRAM with PMA. One approach is to apply an in-plane magnetic field along the direction of the writing current. Another approach involves the deformation of the structure. A third approach requires tilting of the anisotropy by wedge-shaped ferromagnets; and another approach uses an antiferromagnet-ferromagnet bilayer system, a fifth uses competing spin currents. Unfortunately, all of these approaches increase the fabrication complexity, are highly sensitive to the switching current duration and magnitude or increase the switching energy. It is therefore critical to develop an energy-efficient PMA SOT-MRAM that is simple to fabricate, robust to switching current parameters, and does not require an external magnetic field.

The illustrative embodiments provide a simple SOT-MRAM structure with PMA wherein deterministic toggle switching is achieved without requiring additional device components. The illustrative embodiments provide a toggle PMA SOT-MRAM that exploits the precessional nature of field-like SOT to achieve field-free and energy-efficient switching with a simple structure that is robust to the switching current magnitude and duration. Leveraging SOT toggle switching, the illustrative embodiments apply unidirectional SOT current pulses that toggle the PMA MRAM between the parallel state (magnetization of fixed and free ferromagnets in the same direction) and anti-parallel state (magnetization of fixed and free ferromagnets in opposite directions). With this toggle switching, each SOT pulse flips the stored magnetization of the free ferromagnet, irrespective of its initial direction. The write circuit can use this toggle switching mechanism for selective directional switching. The toggle switching of the illustrative embodiments is in contrast to the bidirectional currents required for conventional SOT-MRAM devices with directional switching.

Figure 3:
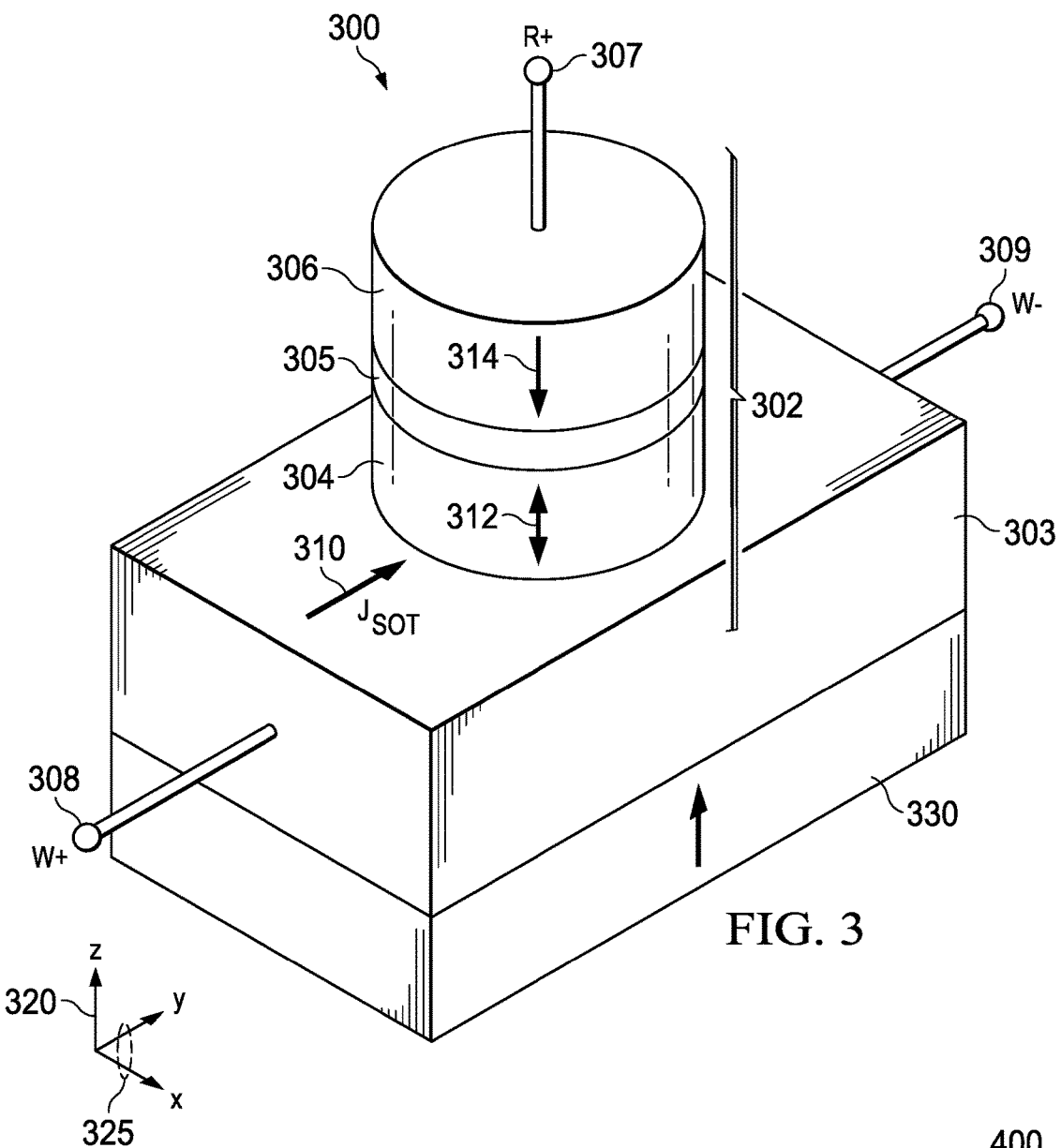
FIG. 3 illustrates a three-terminal, SOT-driven toggle MRAM with PMA in accordance with an illustrative embodiment.

FIG. 3 illustrates a three-terminal, SOT-driven toggle MRAM with PMA in accordance with an illustrative embodiment. SOT-driven toggle MRAM 300 has a three-terminal magnetic tunnel junction (MTJ) 302 comprising a fixed ferromagnet 306 and free ferromagnet 304 separated by insulating tunnel barrier 305 that is sandwiched between the fixed ferromagnet 306 and free ferromagnet 304. The fixed ferromagnet layer 306 is adjacent a first side of the insulating tunnel barrier 305, and the free ferromagnet layer 304 is adjacent a second side of the insulating tunnel barrier opposite the fixed ferromagnet layer.

Both the free ferromagnet 304 and fixed ferromagnet 306 have PMA, with a $\hat{z}$-directed easy axis 320, as indicated by arrows 312 and 314, and hard x-y plane 325. The magnetic anisotropy of the fixed ferromagnet 306 is in the $-\hat{z}$ direction approximately normal to a surface of the fixed ferromagnetic layer 306 with a fixed magnetization 314 generally aligned parallel to the easy axis normal to the interface between the fixed ferromagnet 306 and insulating tunnel barrier 305. The free ferromagnet layer 304 is disposed adjacent to the second surface of the tunnel barrier layer 305, defining an interface, having magnetic anisotropy approximately normal to the interface. The free ferromagnetic layer 304 has a bistable magnetization along the easy axis.

Fixed ferromagnet 306 and free ferromagnet 304 can each be made of different or similar materials, which can include, e.g., Co, Fe, Ni, Gd, Cr, CoFeB, NiFe, CoFe, (Co/Pd)n, CoTb, FeCoNi, Fe/Ni, Co/Ni/Co, YbFeO3, NiMnGa, La1-xCaxMnO3, La1_xSrxMnO3, or any combination thereof. Tunnel barrier 305 can be made of, e.g., MgO, Al2O3, Ta2O5, RuO, or any combination thereof.

The respective diameters of the fixed ferromagnet 306, free ferromagnet 304, and tunnel barrier 305 can range from 2 nm to 200 nm each. For example, the respective diameters of the fixed ferromagnet 306, free ferromagnet 304, and tunnel barrier 305 can be at least 2 nm, such as at least 5 nm, at least 10 nm, at least 20 nm, at least 30 nm, at least 40 nm, and least 50 nm, at least 60 nm, at least 70 nm, at least 80 nm, at least 90 nm, or at least 90 nm. The respective diameters of the fixed ferromagnet 306, free ferromagnet 304, and tunnel barrier 305 can be not greater than 200 nm, such as not greater than 180 nm, not greater than 160 nm, not greater than 140 nm, not greater than 120 nm, not greater than 100 nm, not greater than 80 nm not greater than 70 nm, not greater than 60 nm, not greater than 50 nm, not greater than 40 nm, not greater than 30 nm, not greater than 20 nm, or even not greater than 10 nm. It will be appreciated that the respective diameters of the fixed ferromagnet 306, free ferromagnet 304, and tunnel barrier 305 can be within a range of any minimum or maximum value indicated above, and further appreciated that the respective diameters may be similar or different. In a particular embodiment, the respective diameters of the fixed ferromagnet 306, free ferromagnet 304, and tunnel barrier 305 can be within a range of 5 nm to 50 nm.

The respective thickness of fixed ferromagnet 306 and free ferromagnet 304 can be similar or different, and in some embodiments limited by atom/molecule size of material used. In accordance with an embodiment, the respective thickness of fixed ferromagnet 306 and free ferromagnet 304 can be at least 100 pm, such as at least 150 pm, at least 200 pm, at least 250 pm, at least 300 pm, at least 350 pm, at least 400 pm, at least 450 pm, at least 500 pm, at least 750 pm, at least 1 nm, at least 1.25 nm, at least 1.5 nm, or at least 1.75 nm. The respective thickness of fixed ferromagnet 306 and free ferromagnet 304 can be not greater than 2 nm, such as not greater than 1.75 nm, not greater than 1.5 nm, not greater than 1.25 nm, not greater than 1 nm, not greater than 750 pm, or not greater than 500 pm. It will be appreciated that the respective thickness of fixed ferromagnet 306 and free ferromagnet 304 can be within a range of any minimum or maximum value indicated above. In a particular embodiment, the respective thickness of fixed ferromagnet 306 and free ferromagnet 304 is within a range of 1 nm to 1.5 nm.

The thickness of the tunnel barrier 305 can be similar or different than the thickness of either the fixed ferromagnet 306 or free ferromagnet 304 and may be limited by atom/molecule size of material used. In accordance with an embodiment, the thickness of the tunnel barrier 305 can be at least 500 pm, such as at least 600 pm, at least 700 pm, at least 800 pm, at least 900 pm, or at least 1 nm. The thickness of the tunnel barrier 305 can be not greater than 1.5 nm, such as not greater than 1.25 nm, not greater than 1 nm, not greater than 900 pm, or not greater than 800 pm. It will be appreciated that the thickness of the tunnel barrier 305 can be within a range of any minimum or maximum value indicated above. In a particular embodiment, the thickness of the tunnel barrier 305 is within a range of 800 pm to 900 pm.

A heavy metal layer 303 can be disposed adjacent the free ferromagnet 304 on the side opposite the tunnel barrier 305. Heavy metal layer 303 can be made of, e.g., Pt, Ta, W, Cu, TaN, CuIr, Hf, or any combination thereof. The respective width and length of heavy metal layer 303 can be within a range of any minimum or maximum diameter of the free ferromagnet 304 disclosed herein and may further be selected depending on connectivity requirements. According to an embodiment, the width and/or length of heavy metal layer 303 can be at least 5 nm, such as at least 10 nm, at least 20 nm, at least 30 nm, at least 40 nm, at least 50 nm, at least 60 nm, and not greater than 100 nm, not greater than 90 nm, not greater than 80 nm, not greater than 70 nm, not greater than 60 nm, or not greater than 50 nm. In an embodiment, the thickness of heavy metal layer 303 may be limited by atom/molecule size of material used. In an embodiment, the thickness of heavy metal layer 303 can be at least 150 pm, at least 200 pm, at least 250 pm, at least 300 pm, at least 350 pm, at least 400 pm, at least 450 pm, at least 500 pm, at least 750 pm, at least 1 nm, at least 1.25 nm, at least 1.5 nm, at least 1.75 nm, at least 2 nm, at least 3 nm, at least 4 nm, at least 5 nm, at least 6 nm, at least 7 nm, at least 8 nm, at least 9 nm, or at least 10 nm. The heavy metal layer 303 can be not greater than 11 nm, such as not greater than 11 nm, not greater than 10 nm, not greater than 9 nm, not greater than 8 nm, not greater than 7 pm, not greater than 6 nm, not greater than 5 nm. It will be appreciated that the heavy metal layer 303 can be within a range of any minimum or maximum value indicated above. In a particular embodiment, the heavy metal layer 303 is within a range of 1.5 nm to 5 nm.

Magnetic tunnel junction 302 further comprises a read terminal R+ 307 coupled to fixed ferromagnet 306, positive write terminal W+ 308 attached to one section of the heavy metal 303, and negative write terminal W− 309 attached to another section of the heavy metal for connecting electrical signals, voltages, and currents. Write terminals W+ 308 and W− 309 are disposed with respect to each other such that when SOT electrical current 310 (JSOT) flows through heavy metal 303 from W+ 308 to W− 309, JSOT induces spin-orbit torque (SOT) on adjacent free ferromagnet 304.

The SOT induced by current 310 flowing from write terminal W+ 308 to write terminal W− 309 switches the magnetization of the free ferromagnet 304. When the magnetization of the free ferromagnet 304 switches, the electrical resistance between the read terminal R+ 307 and the W− terminal 309 can be switched between two stable resistance states. The bistable magnetization of the free ferromagnet layer 304 can be in one of two stable resistance states comprising a parallel state in which the bistable magnetization is generally parallel to the fixed magnetization of the fixed ferromagnet layer 306, and an anti-parallel state in which the bistable magnetization is generally anti-parallel to the fixed magnetization of the fixed ferromagnet layer 306.

The magnetization 312 of the free ferromagnet 304 can toggle between the two stable resistance states in the +$\hat{z}$ and −$\hat{z}$ directions, respectively, by applying the unidirectional current 310 through the write path from terminal W+ 308 to terminal W− 309. The two stable resistance states of MTJ 302 include a low resistance state that corresponds to the parallel state and a high resistance state that corresponds to the anti-parallel state. See Table 1. The resistance states are switched as a result of spin-orbit torque exerted by electrical current pulse 310 on the free ferromagnet 304 followed by relaxation to an easy axis of the free ferromagnet. Each time a subsequent electrical current pulse 310 flows through the heavy metal layer 303, the free ferromagnet 304 toggles once between the parallel and antiparallel states that result in the low and high electrical resistance states, respectively.

TABLE 1

| Relative Magnetization | Tunneling Probability | Electrical Resistance |
|---|---|---|
| Anti-parallel | Low | High |
| Parallel | High | Low |

The state of the MTJ 302 can be read by applying a voltage between read terminal R+ 307 and write terminal W− 309. The resistance state of MTJ 302 is determined by a tunneling magnetoresistance effect on the current applied through the read path from R+ 307 to W− 309, as shown in Table 1.

In an embodiment, a compensating ferromagnet 330 can be disposed adjacent the heavy metal 303 on the side opposite the free ferromagnet 304 for stray dipolar field cancellation. The presence of a stray dipolar field acting upon the free ferromagnet 304 (e.g., a stray dipolar field provided by the fixed ferromagnet 306) can act to decrease the toggle range when an initial magnetization state of the free ferromagnet 304 is parallel to the stray dipolar field, or increase the toggle range when the initial magnetization state of the free ferromagnet 304 is antiparallel to the stray dipolar field. In accordance with an embodiment, the compensating ferromagnet 330 can provide a compensating dipolar field to counteract a stray dipolar field greater than 1.0 mT, such as greater than 1.5 mT, greater than 2.0 mT, greater than 2.5 mT, greater than 3.0 mT, greater than 3.5 mT, greater than 4.0 mT, or even greater than 4.5 mT.

Figure 11:
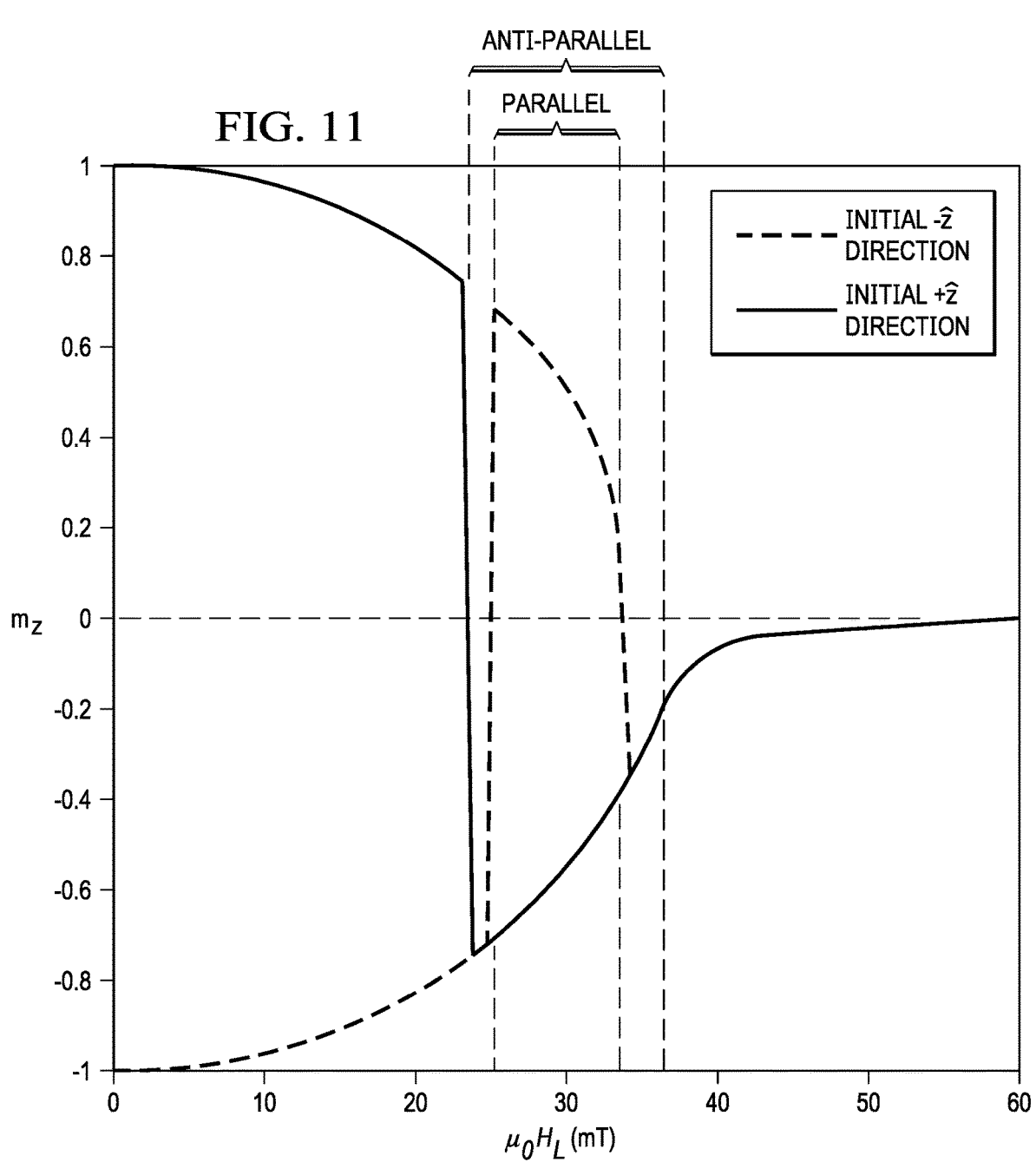
FIG. 11 depicts a graph illustrating the effects of a coupling field from the fixed ferromagnet on toggling behavior in accordance with an illustrative embodiment.

As shown in FIG. 11, the presence of a coupling field from the fixed ferromagnet can cause asymmetric switching behavior, where the toggle range is broader for the magnetization favored by the fixed ferromagnet. FIG. 11 shows an analysis of fixed ferromagnet coupling impact on toggle switching for a 1 mT dipolar field acting on the free ferromagnet in the −$\hat{z}$ direction. The vertical dashed lines represent the toggle range for initial magnetization antiparallel and parallel to the fixed ferromagnet direction, as indicated. The $\mu_0 H_L$ range bounded by the inner dashed lines is shared by both toggle directions, and therefore determines the effective toggle range. The presence of dipolar fields thus decreases the toggle range when the initial free layer magnetization is parallel to the dipolar field and increases it when the initial free layer magnetization is antiparallel to the dipolar field. For the parameters evaluated in these simulations, there is no toggle switching if the dipolar field is greater than ~2.5 mT. This issue can be resolved with the dipolar field from a compensating ferromagnet.

Figure 4:
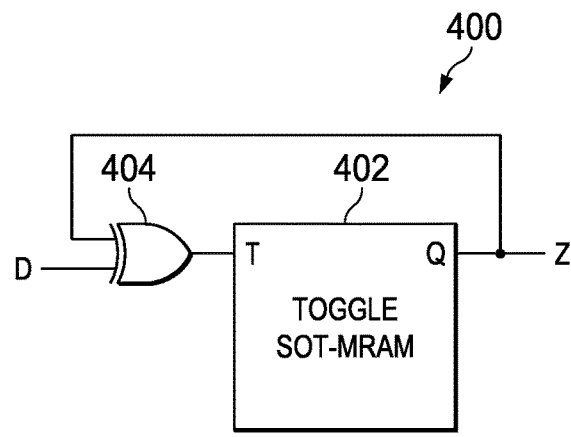
FIG. 4 illustrates a circuit for performing bidirectional switching with a toggle SOT MRAM in accordance with an illustrative embodiment.

FIG. 4 illustrates a circuit for performing bidirectional switching with a toggle SOT MRAM in accordance with an illustrative embodiment. Circuit 400 is an example implementation of SOT-driven toggle MRAM 300 shown in FIG. 3.

By comparing the input bit D with the prior written data Q and writing the output into the SOT-MRAM 402, the toggle mechanism can be applied to directional switching. The circuit 400 applies a toggle pulse T to the SOT-MRAM 402 only when the incoming bit D is different from the stored bit Q, allowing directional memory storage with a simple XOR operation 404.

Table 2 illustrates the corresponding logical relationships for bidirectional switching using circuit 400. When D≠Q, the toggle pulse becomes logical 1, which results in the inversion of the memory state Z. When D=Q, there is no toggle pulse, and Z retains its prior state.

TABLE 2

| Input: D | Prior Data: Q(t) = Z(t) | Toggle Pulse: T | Result: Q(t + 1) = Z(t + 1) |
|---|---|---|---|
| 0 | 0 | 0 | 0 |
| 0 | 1 | 1 | 0 |
| 1 | 0 | 1 | 1 |
| 1 | 1 | 0 | 1 |

Figure 5A:
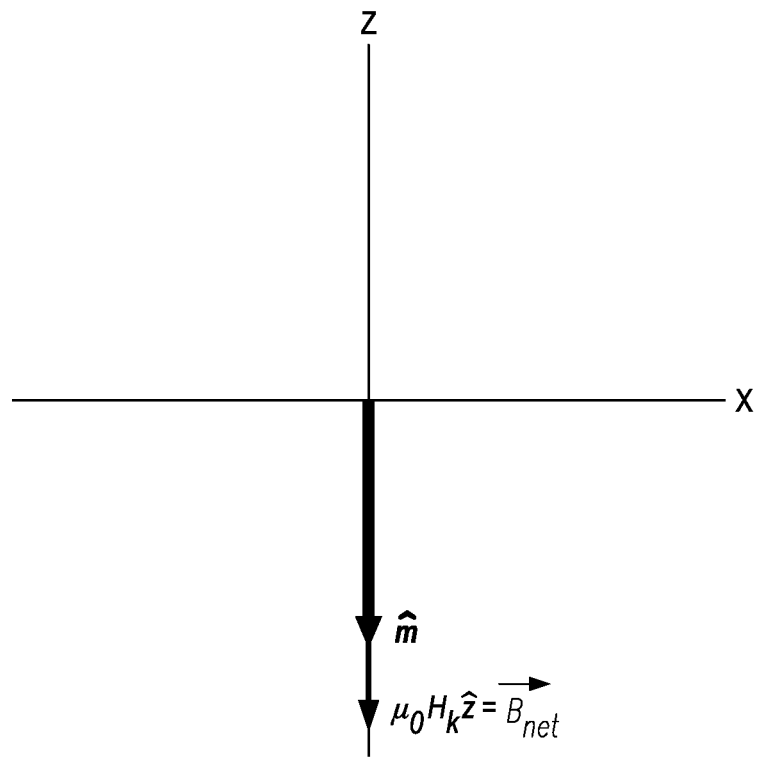
FIG. 5A illustrates free ferromagnet magnetization $\hat{m}$ in an initially relaxed state at $-\hat{z}$ direction before the application of SOT excitation in accordance with an illustrative embodiment.

FIGS. 5A-5F are a set of graphical plots illustrating the magnetization switching mechanism underlying the toggle switching process for SOT-driven toggle MRAM. FIG. 5A illustrates free ferromagnet magnetization in in an initially relaxed state at −$\hat{z}$ direction before the application of SOT excitation. FIG. 5A represents a low magnetoresistance state wherein both magnetizations of the free ferromagnet and fixed ferromagnet are stable in the −$\hat{z}$ direction.

Figure 5B:
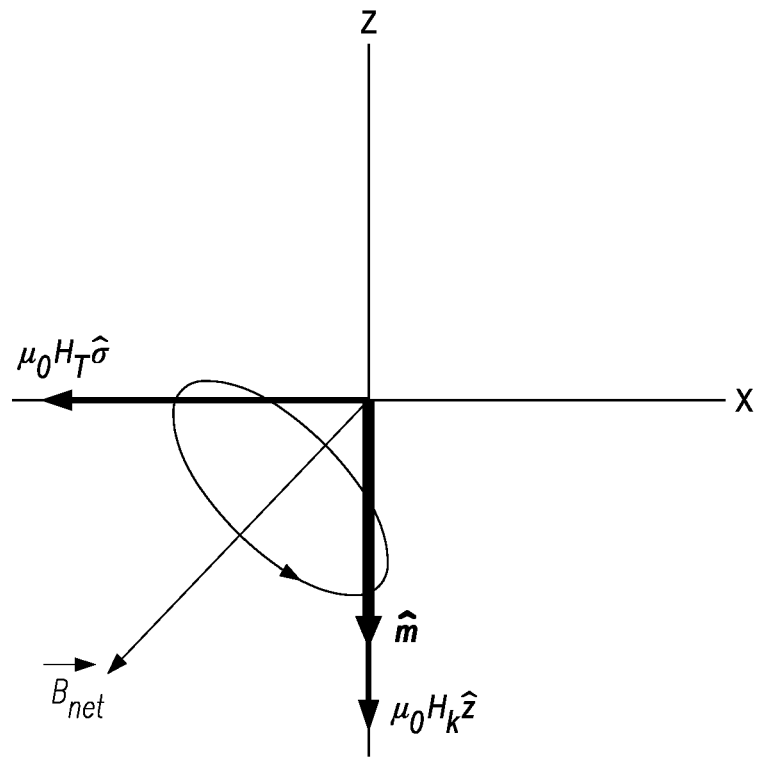
FIG. 5B illustrates the precession of the magnetization of the free ferromagnet when a write current is applied through the heavy metal in accordance with an illustrative embodiment.

FIG. 5B illustrates the precession of the magnetization of the free ferromagnet when a write current is applied through the heavy metal.

As shown in FIG. 5B, the interplay between the PMA field $\mu_0 H_k \hat{z}$, and the field-like SOT $\mu_0 H_l \hat{\sigma}$ causes $\hat{m}$ to precess around the net magnetic field $\vec{B}_{net}$ of the system.

Figure 5C:
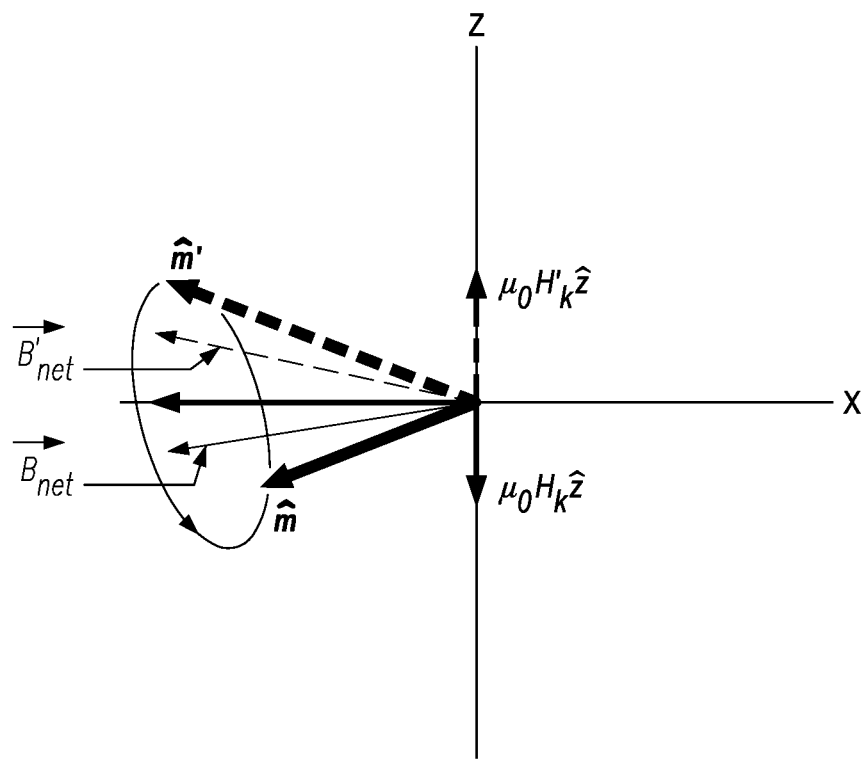
FIG. 5C illustrates the magnetization of the free ferromagnet crossing the hard x-y plane as it precesses in accordance with an illustrative embodiment.

FIG. 5C illustrates the magnetization of the free ferromagnet crossing the hard x-y plane as it precesses. Gilbert damping decreases the radius of the circular trajectory and applies a torque on $\hat{m}$ to align it along $\vec{B}_{net}$. The magnitude and direction of $\vec{B}_{net}$ also changes due to the varying perpendicular magnetic anisotropy field $\mu_0 H_{K,eff} m_z \hat{z} = \mu_0 H_K \hat{z}$.

Figure 5D:
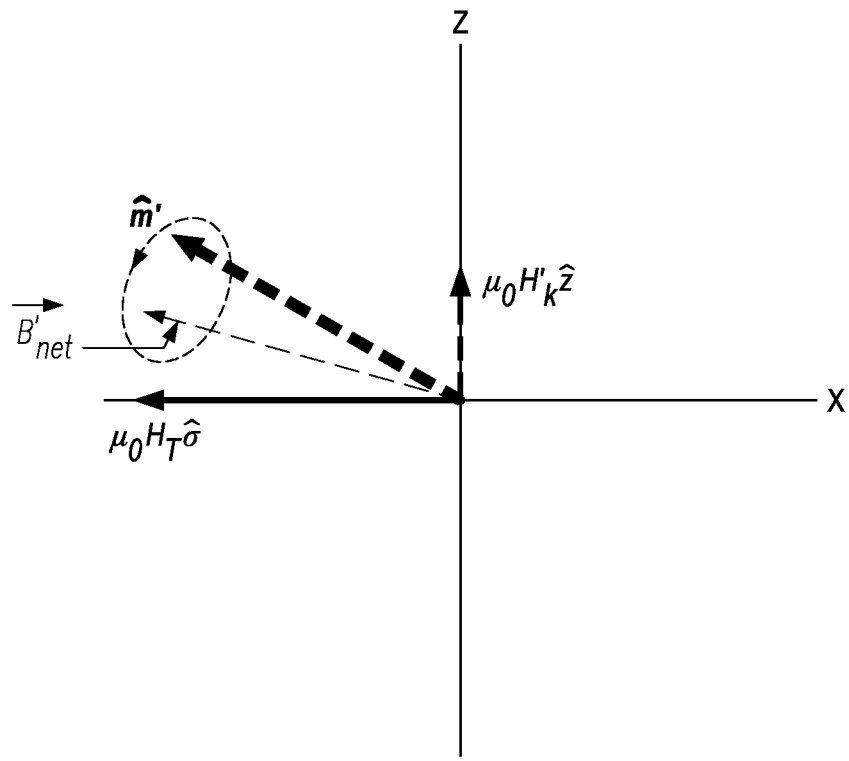
FIG. 5D illustrates both the magnetization and net magnetic field crossing the hard x-y plane in accordance with an illustrative embodiment.

As shown in FIG. 5D, the precessional and damping forces cause both the free ferromagnet magnetization $\hat{m}$ and net magnetic field $\vec{B}_{net}$ to cross the hard x-y plane.

Figure 5E:
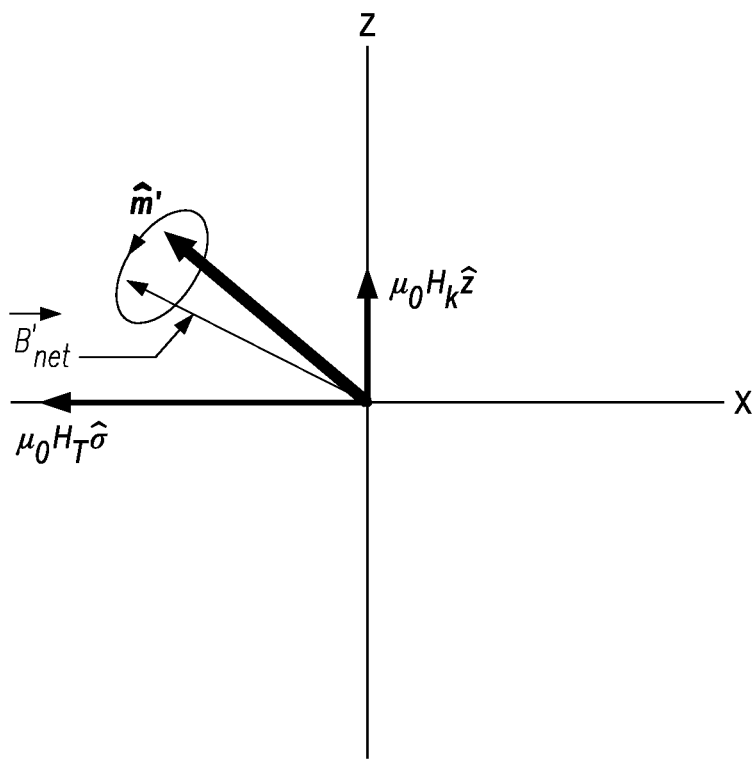
FIG. 5E illustrates the magnetization m̂ of the free ferromagnet reaching a stable excited state in accordance with an illustrative embodiment.

FIG. 5E illustrates the magnetization $\hat{m}$ of the free ferromagnet reaching a stable excited state. The radius of the circular trajectory approaches zero with $\hat{m}$ and $\vec{B}_{net}$ across the hard x-y plane, causing $\hat{m}$ to reach a stable excited state with positive z magnetization not aligned with the easy axis.

Figure 5F:
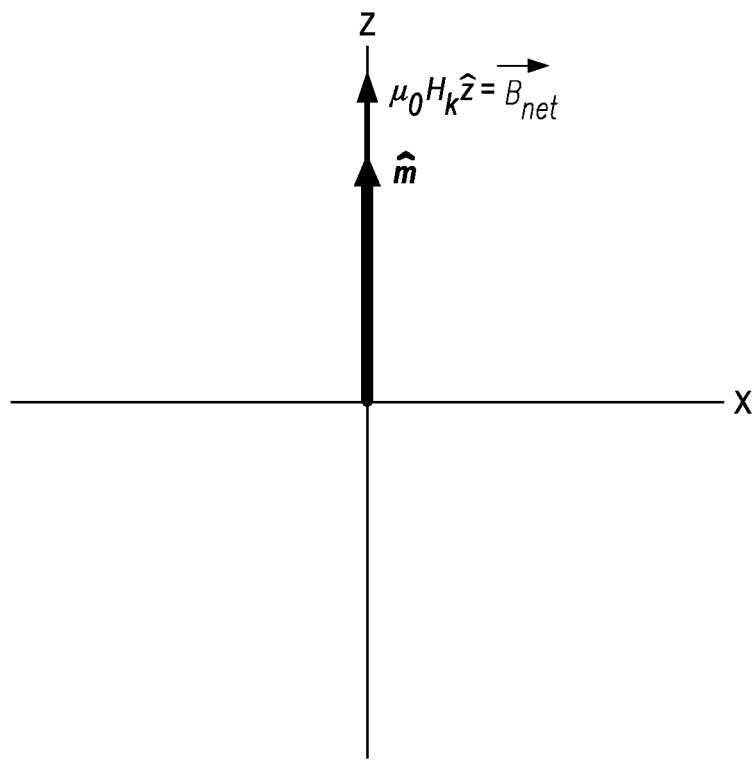
FIG. 5F illustrates the magnetization m̂ of the free ferromagnet in the +ẑ direction when the SOT excitation is removed in accordance with an illustrative embodiment.

FIG. 5F illustrates the magnetization $\hat{m}$ of the free ferromagnet in the $+\hat{z}$ direction when the SOT excitation is removed. As shown in FIG. 5F, switching off the SOT excitation causes $\hat{m}$ to relax in the $+\hat{z}$ direction (the nearest easy axis direction), opposite the initial state, thereby switching the MTJ to a high magnetoresistance state.

When the next write current is applied, the magnetization $\hat{m}$ of the free ferromagnet will toggle back to the $-\hat{z}$ direction. As $\hat{m}$ crosses the hard x-y plane exactly once during each application of a SOT current, the MTJ toggles between the parallel and antiparallel states every time a SOT current is applied.

Figure 6:
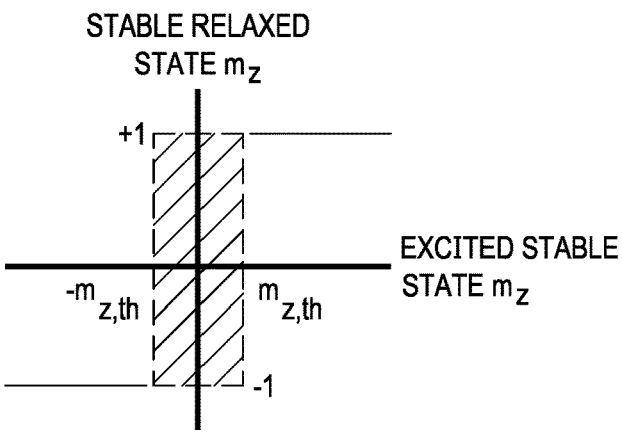
FIG. 6 illustrates a SOT excited stable state versus stable relaxed state in accordance with an illustrative embodiment.

FIG. 6 illustrates a SOT excited stable state versus stable relaxed state in accordance with an illustrative embodiment. The hashed portion between thresholds $+m_{z,th}$ and $-m_{z,th}$ is the region where thermal noise might cause unpredictable behavior.

Figure 7B:
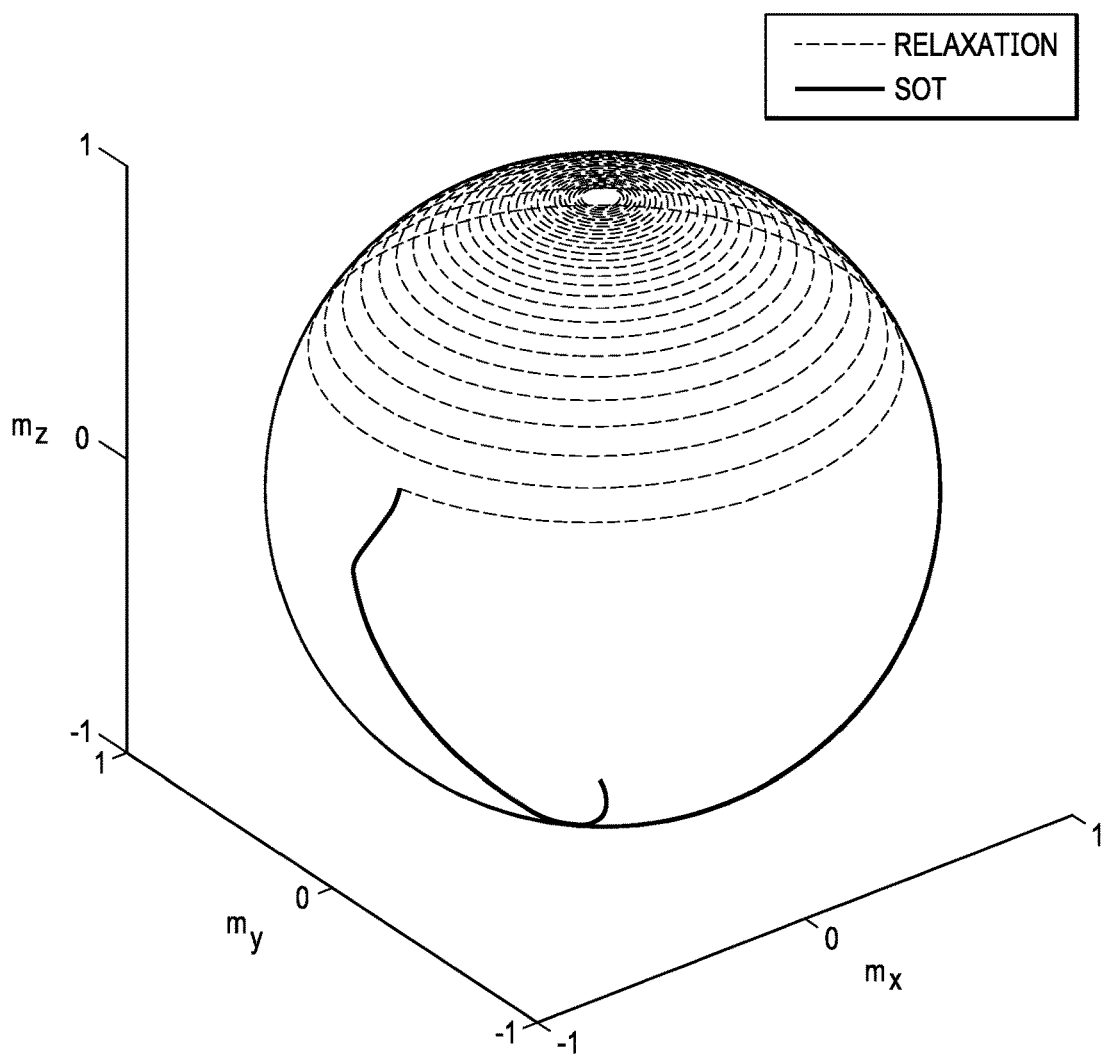
FIG. 7B depicts the trajectory of m̂ in a unit sphere during SOT excitation and relaxation in accordance with an illustrative embodiment.
Figure 7A:
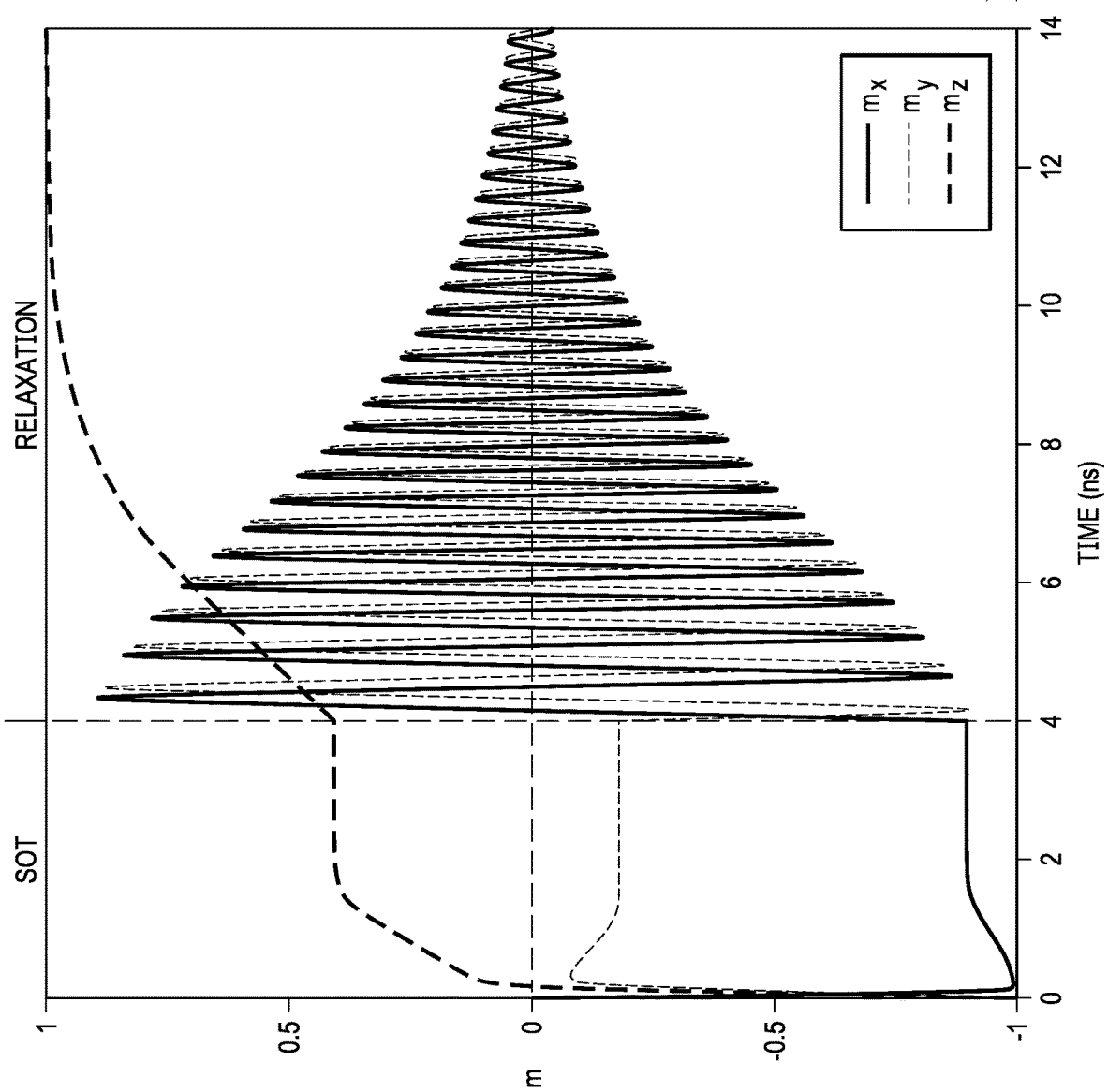
FIG. 7A depicts a graph illustrating time vs. normalized magnetization in accordance with an illustrative embodiment.
Figure 7C:
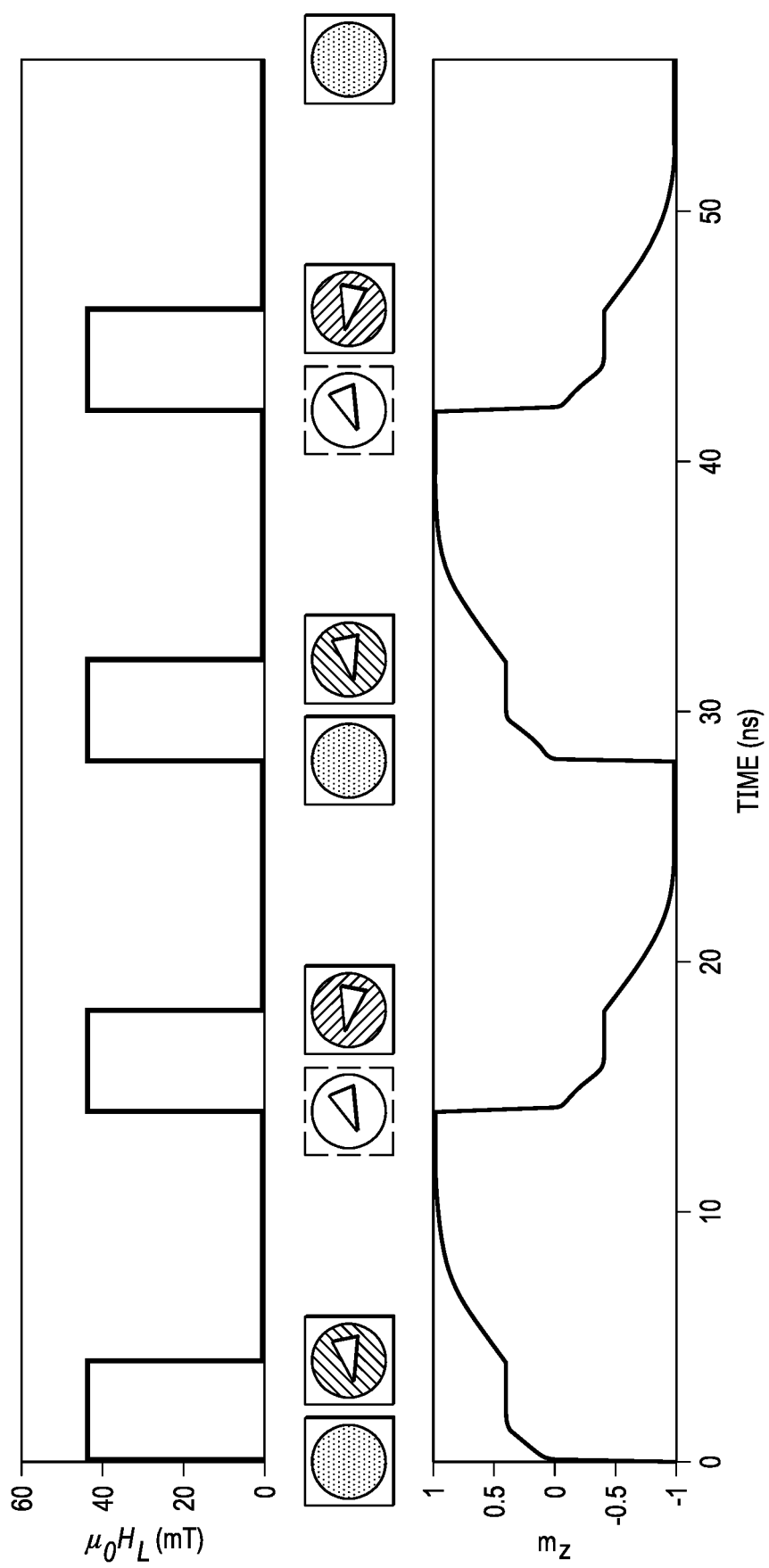
FIG. 7C depicts graphs illustrating multiple magnetization toggles in accordance with an illustrative embodiment.

FIGS. 7A-7C are a set of graphs illustrating micromagnetic simulation of toggle switching. In this example simulation the circular monodomain free ferromagnet has a 30 nm diameter and a 1.2 nm thickness, and the material parameters include: saturation magnetization $\mu_0 M_s = 1.3$ T, effective anisotropy field $\mu_0 H_{K,eff} = 250$ mT, Gilbert damping factor $\alpha = 0.02$, field to damping component ratio $\beta = 2$. As shown in FIGS. 7A-7C, the magnetization is initialized at $m_z = -1$, and the application of the SOT current causes $\hat{m}$ to cross the hard axis and reach a stable excited state with $m_z \approx +0.4$. When the SOT current is removed, $\hat{m}$ precesses around the easy axis as it relaxes to $m_z = +1$, having flipped its orientation relative to the easy axis.

FIG. 7A depicts a graph illustrating time vs. normalized magnetization in accordance with an illustrative embodiment. FIG. 7A shows a SOT current applied for 4 ns, followed by system relaxation in the absence of current. Initially $\hat{m}$ is in the $-\hat{z}$ direction, crosses the hard axis at $t = \sim 180$ ps and reaches a stable excited state of $mz = \sim 0.4$ at $t = \sim 2$ ns. After the current is switched off at $t = 4$ ns, $\hat{m}$ relaxes along the $+\hat{z}$ direction.

FIG. 7B depicts the trajectory of $\hat{m}$ in a unit sphere during SOT excitation and relaxation in accordance with an illustrative embodiment.

FIG. 7C depicts graphs illustrating multiple magnetization toggles in accordance with an illustrative embodiment. As shown in FIG. 7C, multiple 4 ns SOT currents with 10 ns of relaxation between each pulse are applied with magnetic field $\mu_0 H_L$ (upper graph) causing $\hat{m}_z$ to toggle with each applied SOT current pulse (lower graph). The micromagnetic simulation screenshots between the upper and lower graphs demonstrate the switching between the $+\hat{z}$ and $-\hat{z}$ directions.

In the illustrative embodiments, the pulse width of the unidirectional current used for toggling, or SOT pulse, can have a minimum duration of at least 100 ps, at least 200 ps, at least 300 ps, at least 400 ps, at least 500 ps, at least 600 ps, at least 700 ps, at least 800 ps, at least 900 ps, at least 1 ns, at least 2 ns, at least 3 ns, at least 4 ns, at least 5 ns, at least 6 ns, at least 7 ns, at least 8 ns, at least 9 ns, or at least 10 ns. It will be appreciated that the pulse width of the unidirectional current used for toggling can be within a range of any value indicated above.

Figure 12:
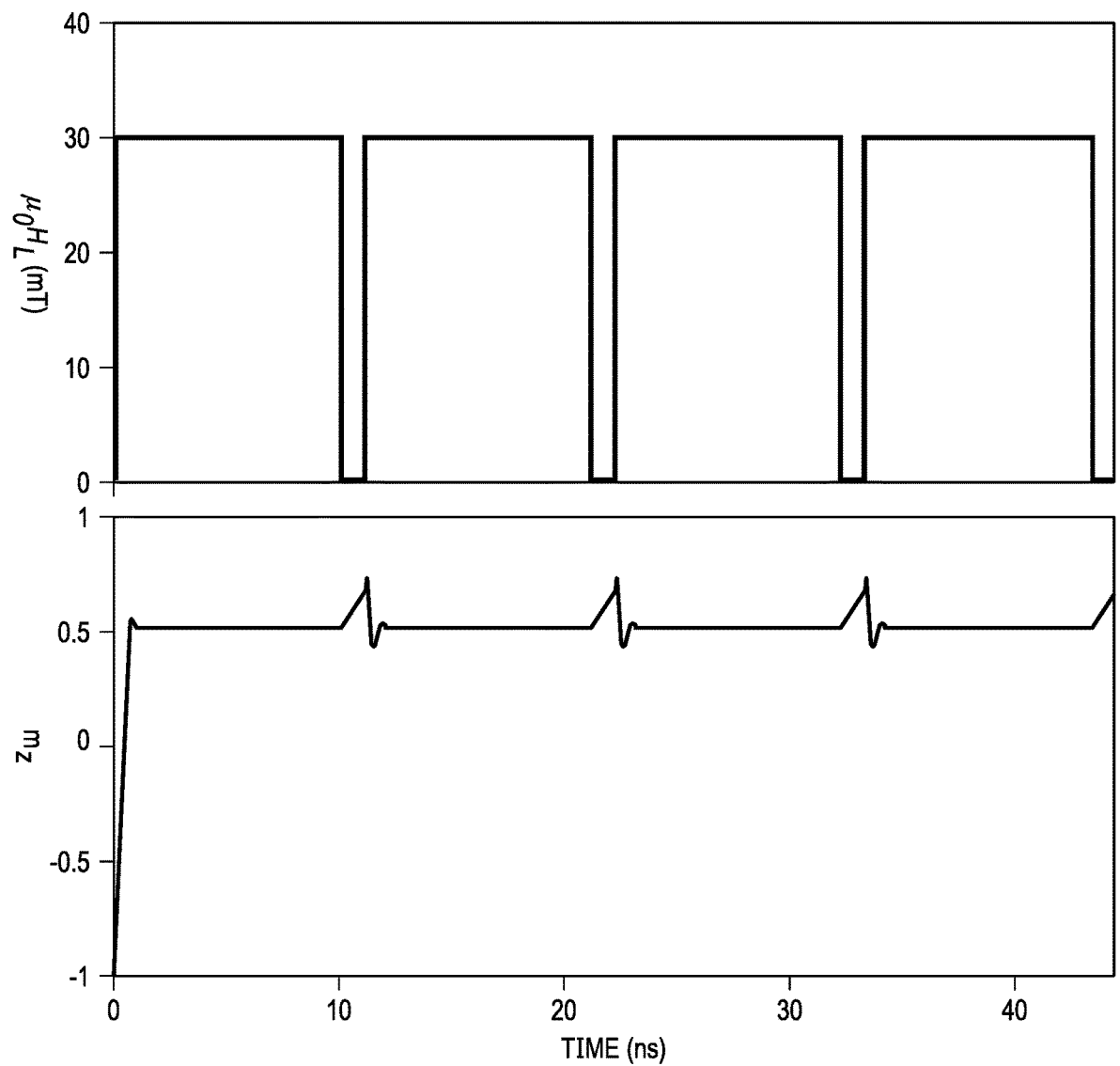
FIG. 12 depicts a graph illustrating the effect of insufficient relaxation time on toggle switching in accordance with an illustrative embodiment.

Insufficient relaxation time between pulses of the unidirectional current used for toggling, or SOT pulses, may cause failure of toggle switching to occur. For example, as illustrated in FIG. 12, a separation of 1 ns was insufficient to relax $\hat{m}$ vertically. As a result, the angular difference between $\hat{m}$ and $\hat{\sigma}$ after the 1 ns relaxation period was insufficient for precessional torque to cause $\hat{m}$ to cross the hard x-y plane.

In accordance with an embodiment, the separation between successive electric current pulses, or the pulse separation width, can have a duration of at least 0.5 ns, at least 1 ns, at least 2 ns, at least 3 ns, at least 4 ns, at least 5 ns, at least 6 ns, at least 7 ns, at least 8 ns, at least 9 ns, or at least 10 ns. It will be appreciated that the pulse separation width can have a duration within a range of any value indicated above.

The toggle SOT MRAM device 300 is highly robust to the switching current magnitude and duration, thereby simplifying the write circuit and improving system efficiency. In particular, the switching mechanism can tolerate write current imprecision greater than 50% and rise times slower than 200 ps. Furthermore, the device structure consists of a minimal number of planar layers, thereby simplifying fabrication and increasing the potential for continued MRAM scaling. The toggle SOT MRAM device 300 thus provides the first robust approach to simultaneously leverage the energy-efficiency of SOT and the thermal stability of PMA without requiring complex fabrication or an external magnetic field.

To demonstrate the exceptional robustness of this toggle MRAM switching, micromagnetic simulations were performed to determine the sensitivity of the switching process on the current amplitude and dynamics.

FIGS. 8A-8D are a set of graphical plots indicating sensitivity of the toggle switching to variations in damping-like SOT field strength, rise time, and $\beta$. To evaluate this robustness—and therefore the precision required to design a CMOS driver circuit—the toggle range within which the switching mechanism behaves properly is defined as:

$$\text{Toggle Range} = \mu_0 H_{L,max} - \mu_0 H_{L,min} \qquad (1)$$

where $\mu_0 H_{L,min}$ and $\mu_0 H_{L,max}$ denote the minimum and maximum damping-like SOT fields, respectively, for which the toggle switching proceeds properly.

FIG. 8A shows the stable excited state magnetization as a function of damping-like SOT field $\mu 0 HL$. The dotted vertical lines denote the boundary of the toggle range for magnetization threshold $|mz,th| = 0.2$. As can be seen in FIG. 8A, damping-like SOT fields smaller than $\mu_0 H_{L,min}$ are insufficient to cause the free ferromagnet magnetization to cross the hard axis. Therefore, no switching occurs.

For damping-like SOT fields greater than $\mu_0 H_{L,max}$, the excited stable state is so close to the hard axis that thermal noise can cause $\hat{m}$ to relax in an unpredictable manner, which is highly problematic for memory applications. A threshold of $m_z=|0.2|$ is used, which ensures relaxation in less than 10 ns. For a robustness metric more relevant to device and circuit fabrication, we further define the toggle range ratio as $$\text{Toggle Range Ratio} = \frac{\mu_0 H_{L,max} - \mu_0 H_{L,min}}{\mu_0 H_{L,min}} = \frac{J_{SOT,max} - J_{SOT,min}}{J_{SOT,min}} \quad (2)$$

where $J_{SOT,min}$ and $J_{SOT,max}$ denote the actual minimum and maximum in-plane current values through the heavy metal layer corresponding to proper toggle switching.

Based on these metrics, the robustness to the magnitude and rise time of the SOT current pulse is analyzed for various ratios between the transverse magnetic field $\mu_0 H_T \hat{\sigma}$ and longitudinal magnetic field $\mu_0 H_L$ ($\hat{m} \times \hat{\sigma}$), expressed as the field-to-damping component ratio $\beta$ as a function of the spin polarization direction of SOT current, $\hat{\sigma}$. $\beta$ values ranging from 2 to 8 have been reported, with Legrand having demonstrated toggle switching for $\beta$ values between 1.82 and 4.35.

In accordance with an embodiment, a unidirectional current can include a current density for successful toggling that can be at least 1e11 A/m^2, such as at least 1e12 A/m^2, at least 2e11 A/m^2, at least 3e12 A/m^2. In accordance with an embodiment, a current density for successful toggling cannot be greater than 4e12 A/m^2. It will be appreciated that the current density of the unidirectional current used for toggling can be within a range of any value indicated above.

In accordance with an embodiment, the unidirectional current can include a rise time for successful toggling that can be at least 0 ps, at least 100 ps, at least 200 ps, at least 300 ps, at least 400 ps. In accordance with an embodiment, the unidirectional current for successful toggling cannot be greater than 500 ps. It will be appreciated that the rise time of the unidirectional current used for toggling can be within a range of any value indicated above.

As shown in FIG. 8A, for a particular rise time, successful toggling occurs with current densities ranging from 1e11 A/m^2 (rise time of 0) to 4e12 A/m^2 (rise time of 500 ps). A typical current density can be 0.1e12 to 3.5e12 A/m^2, producing for a rise time of 50 ps.

Figure 8B:
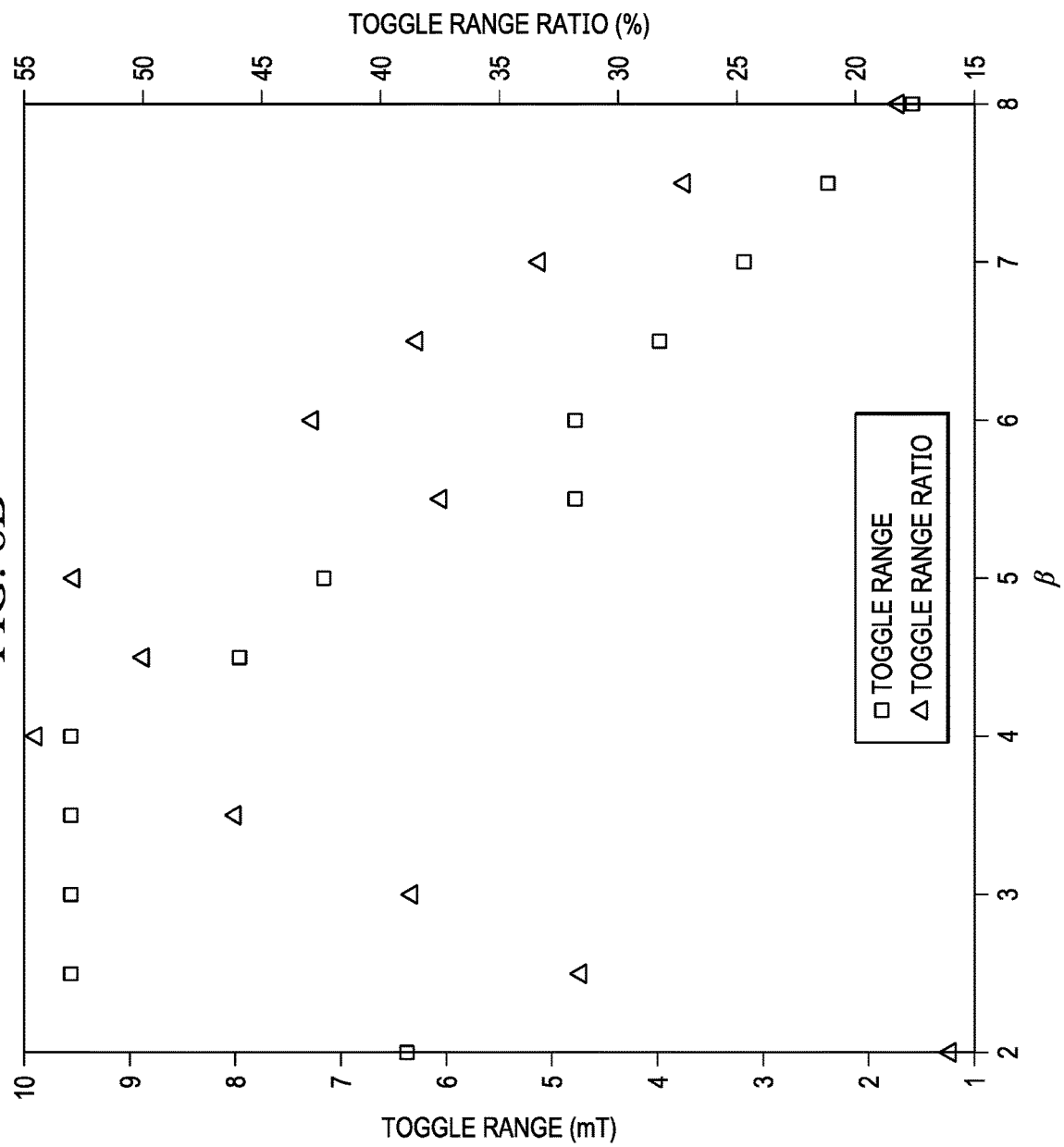
FIG. 8B depicts a graph illustrating toggle range and toggle range ratio as a function of $\beta$ for a step damping-like SOT excitation in accordance with an illustrative embodiment.

FIG. 8B depicts a graph illustrating toggle range $\Delta\mu 0HL$ and toggle range ratio as a function of $\beta$ for a step damping-like SOT excitation (zero rise time). As shown in FIG. 8B, the toggle range is maximized in the $\beta$ range explored by Legrand, with the toggle range ratio above 50% for $\beta$ between 4 and 5 for step current pulses with zero rise time.

Figure 8C:
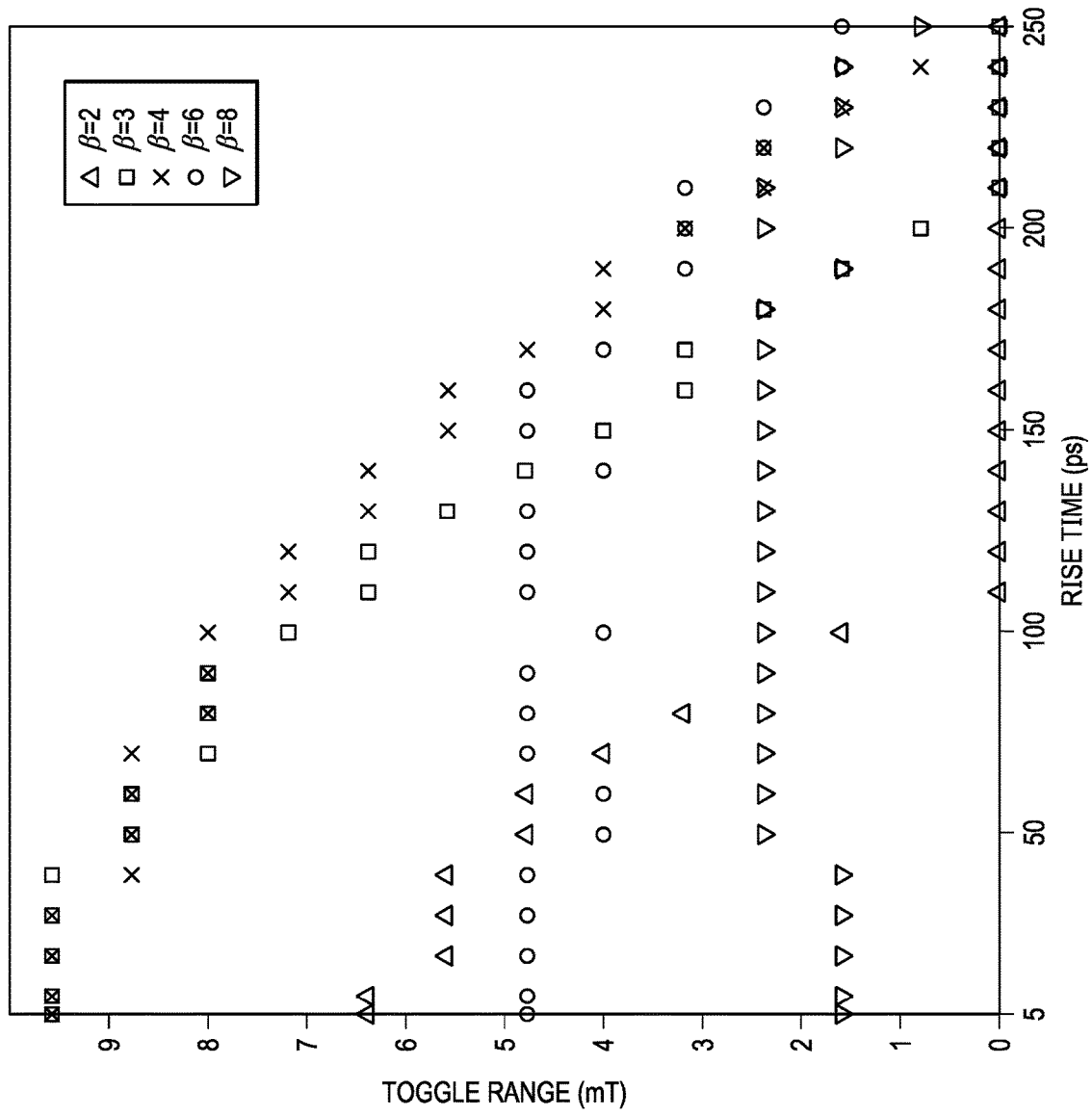
FIG. 8C depicts a graph illustrating toggle range as a function of rise time for various $\beta$ values in accordance with an illustrative embodiment.
Figure 8D:
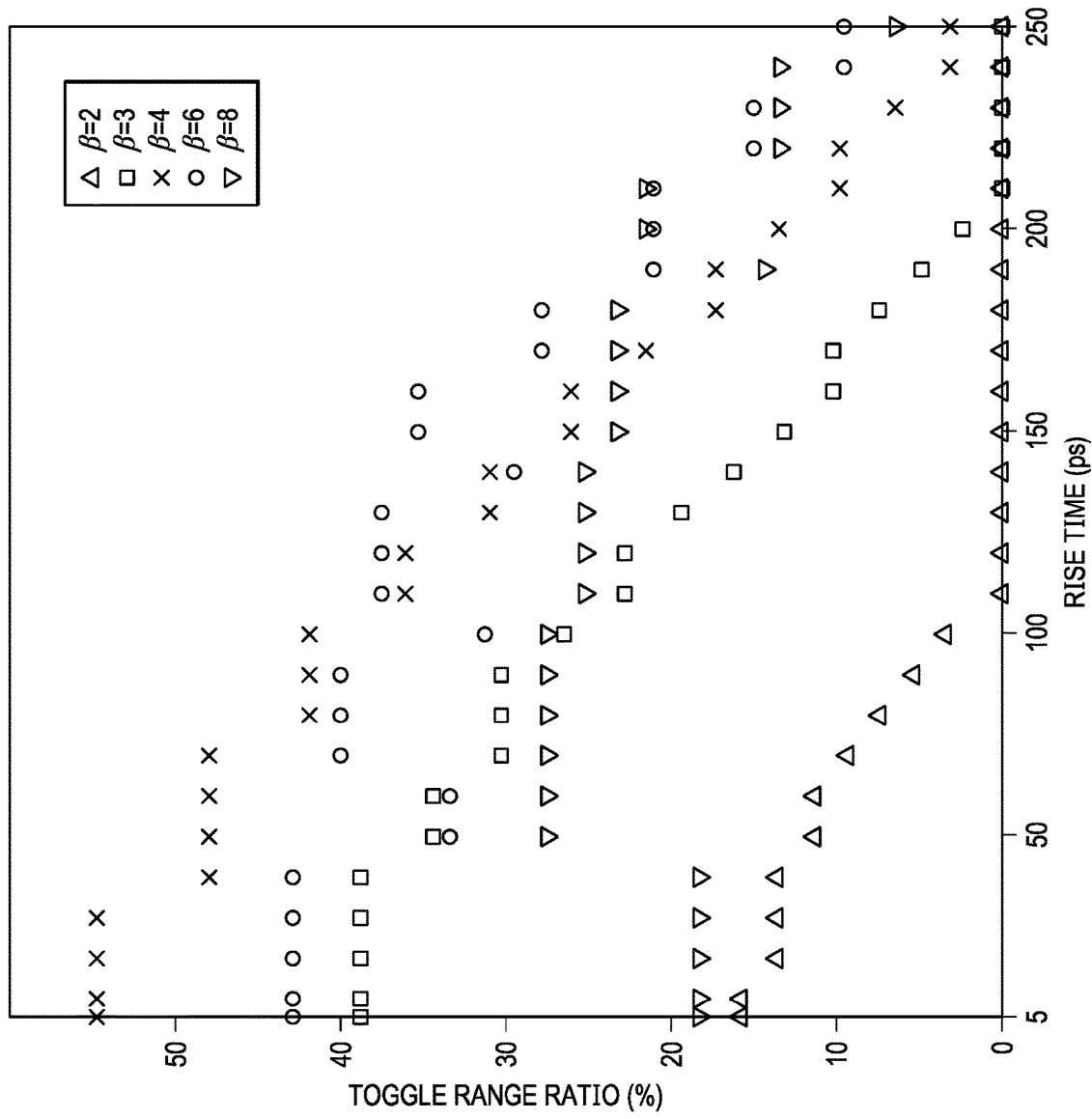
FIG. 8D depicts a graph illustrating rise time versus toggle range ratio for various $\beta$ values in accordance with an illustrative embodiment.

The toggle range and ratio decay with increased rise time, as shown in FIGS. 8C and 8D. FIG. 8C depicts a graph illustrating toggle range as a function of rise time for various $\beta$ values. FIG. 8C illustrates that the damping-like SOT field strength becomes less sensitive to rise time for higher $\beta$ values. FIG. 8D depicts a graph illustrating rise time versus toggle range ratio for various $\beta$ values.

The toggle range and ratio decay with increased rise time as shown in FIGS. 8C and 8D, though proper toggle switching persists for rise times greater than 200 ps. It is observed that the toggle range ratio for $\beta=4$ remains greater than 50% for rise time less than 50 ps. This ratio is significantly larger than has previously been demonstrated with directional SOT switching in a deformation-free antiferromagnet-ferromagnet bilayer system by an energy efficient non-competing current. It should also be noted that while large $\beta$ values do not provide a particularly large toggle range and ratio in response to step inputs, large $\beta$ values provide the greatest toggle range and ratio for SOT current pulses with a large rise time.

Figure 9A:
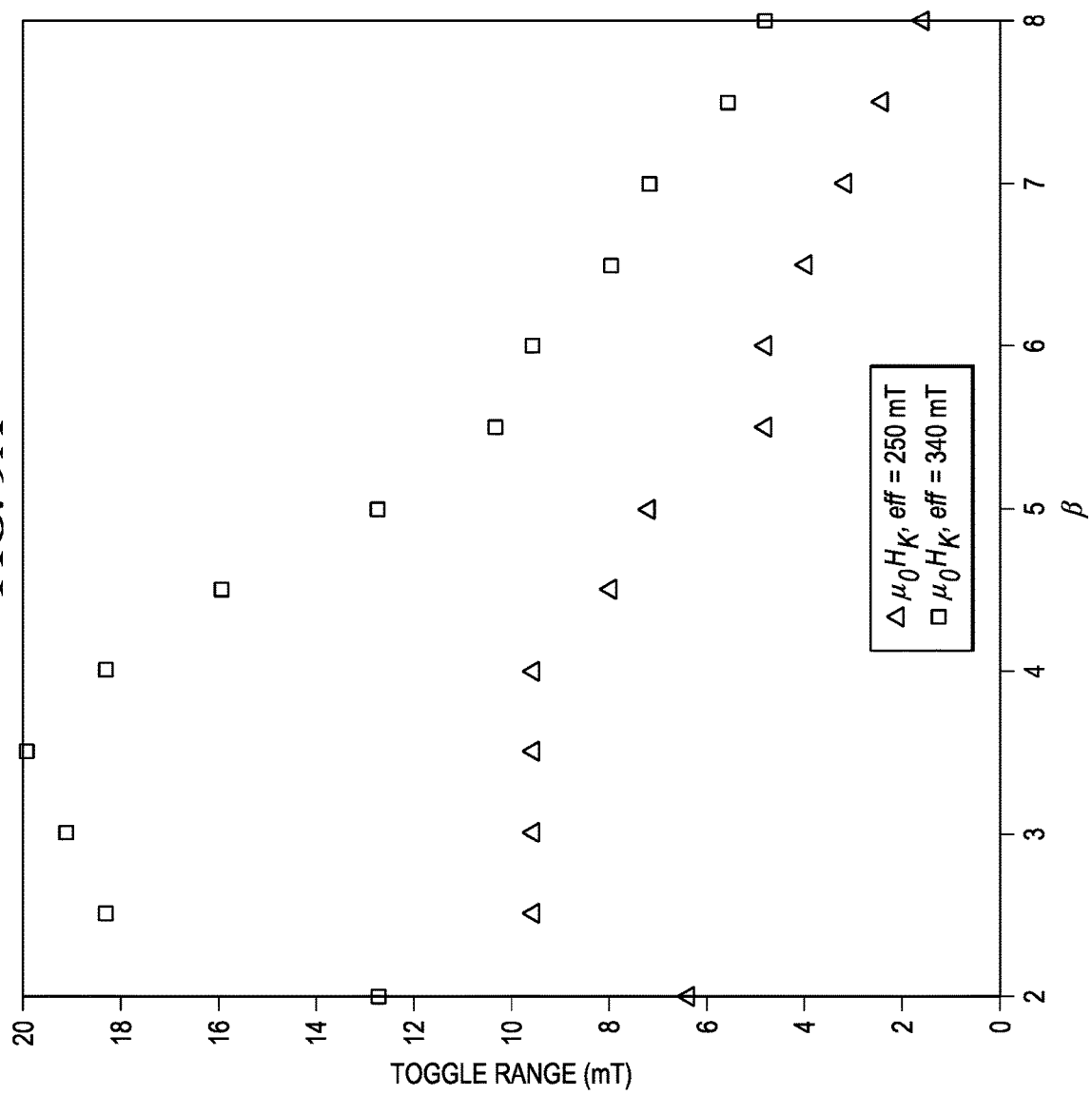
FIG. 9A depicts a graph illustrating $\beta$ versus toggle range in accordance with an illustrative embodiment.
Figure 9B:
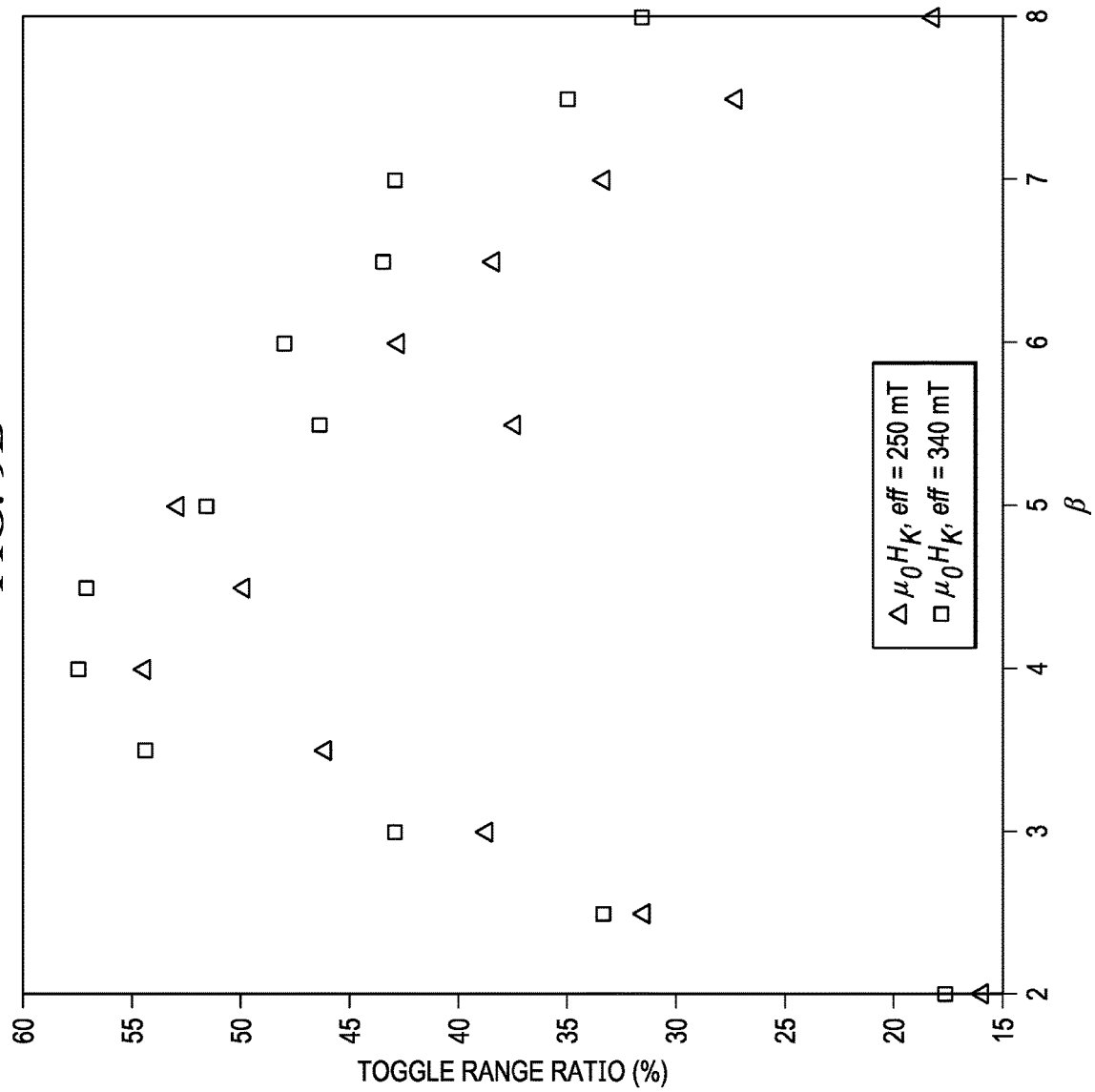
FIG. 9B depicts a graph illustrating $\beta$ versus toggle range ratio for step SOT excitation in accordance with an illustrative embodiment.
Figure 9C:
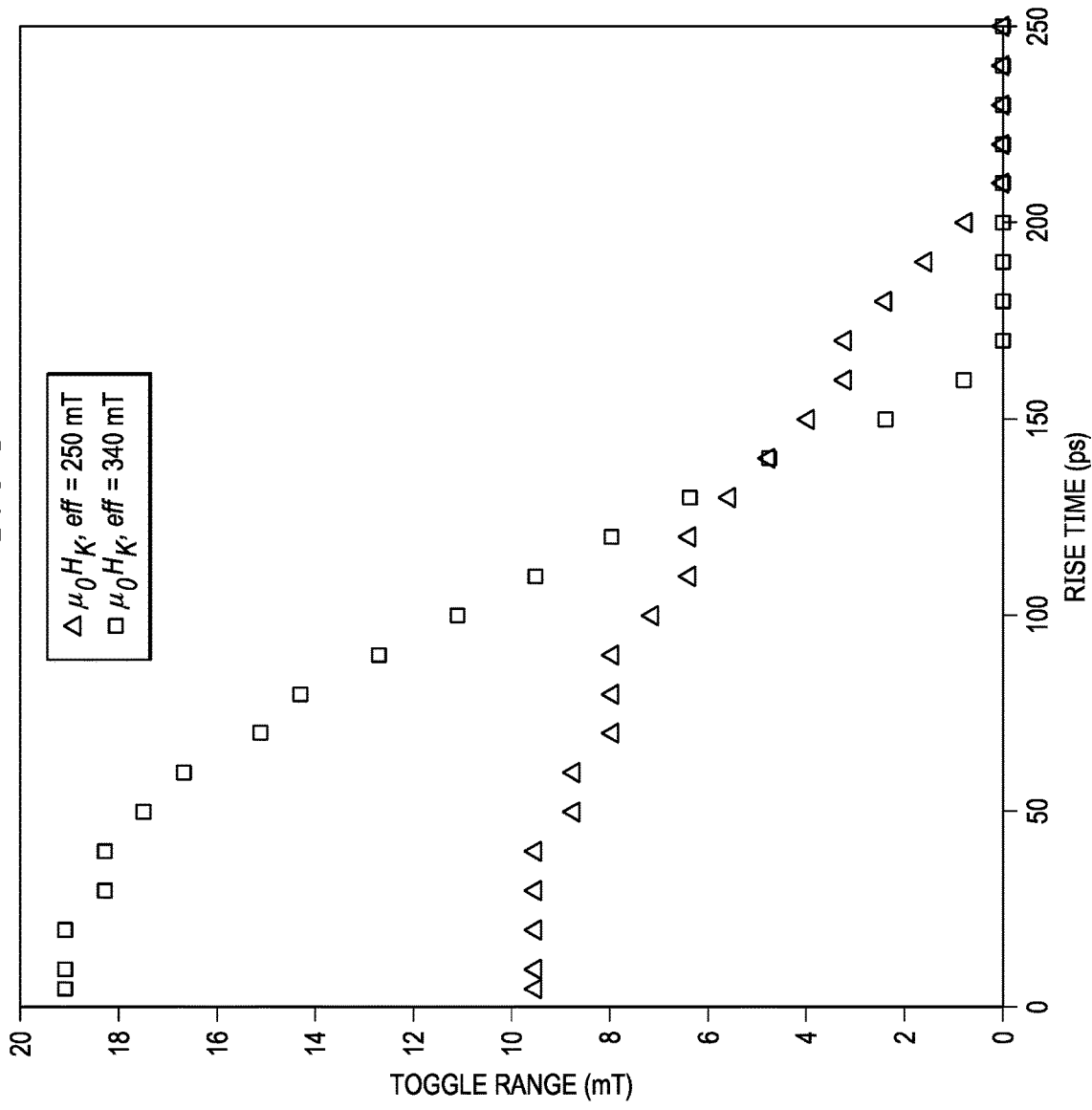
FIG. 9C depicts a graph illustrating rise time versus toggle range for $\beta=3$ in accordance with an illustrative embodiment.
Figure 9D:
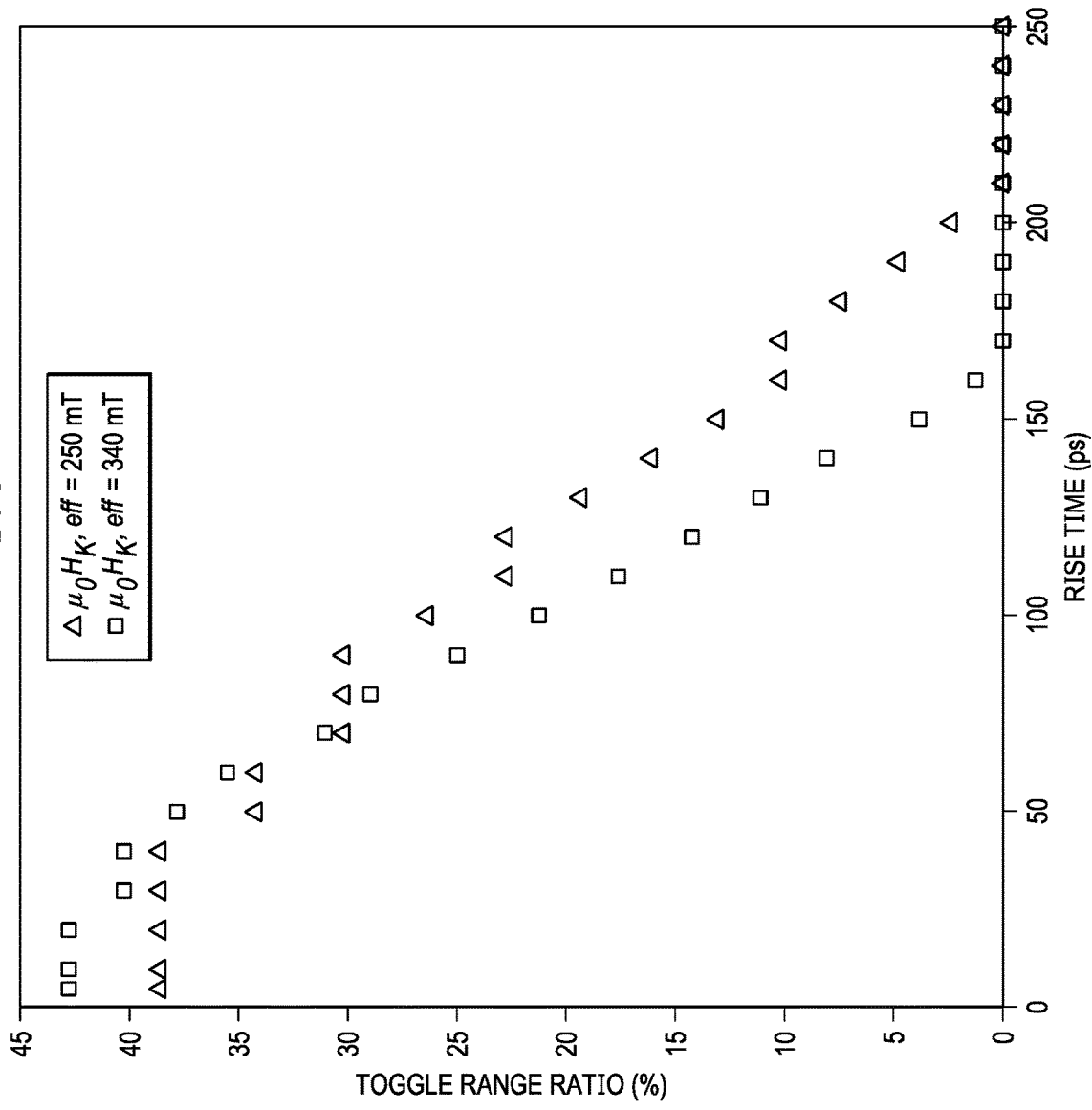
FIG. 9D depicts a graph illustrating rise time versus toggle range ratio for $\beta=3$ in accordance with an illustrative embodiment.

Further analyses have been performed to evaluate the impact of relaxation time and PMA field on this toggle switching mechanism, and to demonstrate its determinism at room temperature. FIGS. 9A-9C show the effect of magnetic anisotropy on toggle switching. A larger anisotropy provides a larger toggle range ratio for fast rise times. However, as the rise time increases, the larger toggle range ratios can be achieved with smaller anisotropy. FIG. 9A illustrates $\beta$ versus toggle range. FIG. 9B illustrates $\beta$ versus toggle range ratio for step SOT excitation. FIG. 9C illustrates rise time versus toggle range for $\beta=3$. FIG. 9D illustrates rise time versus toggle range ratio for $\beta=3$. As shown in FIGS. 9A and 9B, the higher $\mu_0 H_{K,eff}=340$ mT sample provides larger toggle range and toggle range ratio for $-t_{rise}=0$. However, as shown in FIGS. 9C and 9D, the toggle range decreases at a faster rate with an increasing $t_{rise}$ as compared to the lower anisotropy sample. Beyond $t_{rise}=50$ ps for a $\beta$ value of 3, the lower anisotropy sample performs better from a toggle range ratio perspective.

Figure 10:
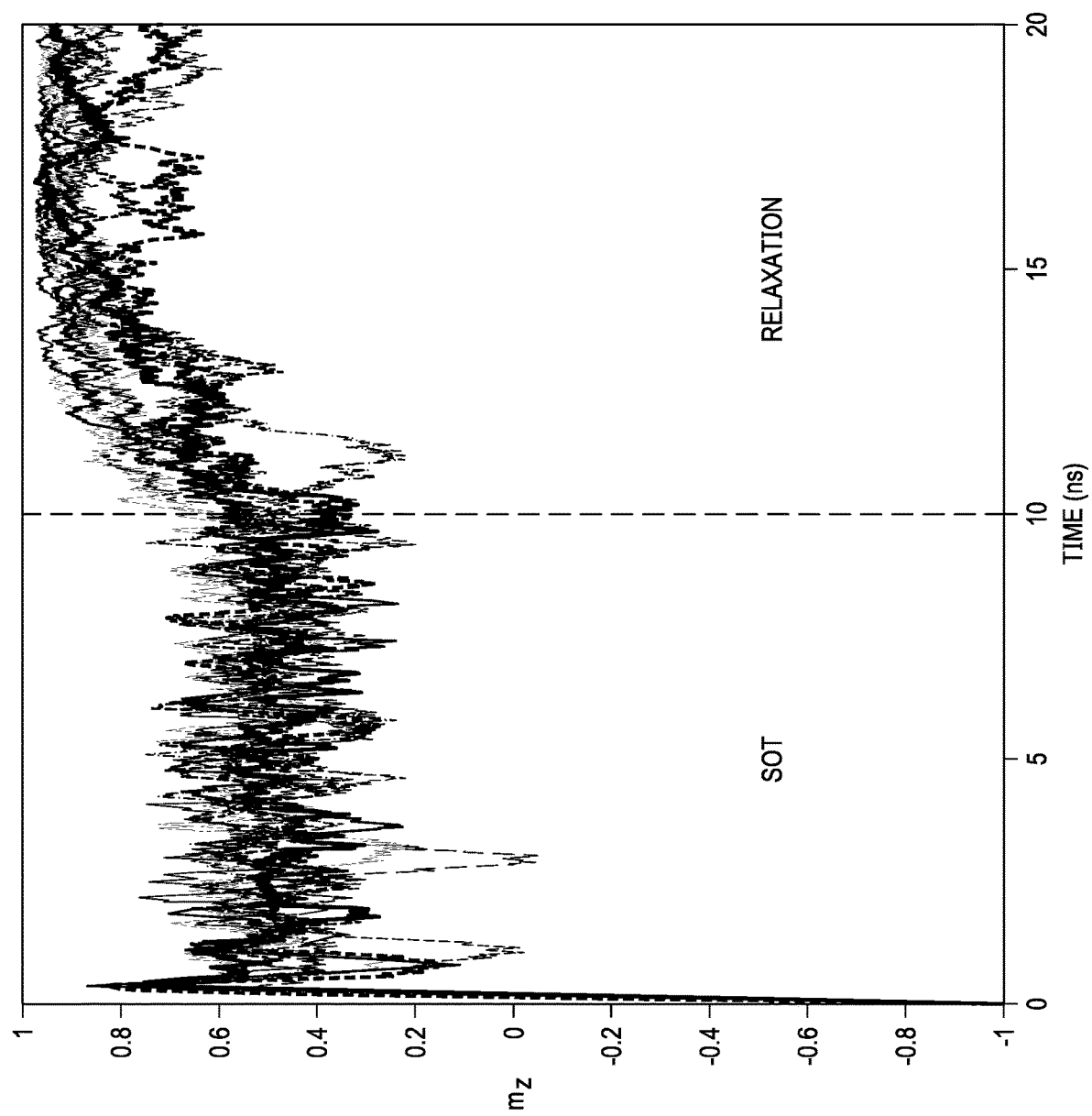
FIG. 10 depicts a graph illustrating room temperature toggle simulations in accordance with an illustrative embodiment.

FIG. 10 depicts a graph illustrating room temperature toggle simulations in accordance with an illustrative embodiment. The different lines represent ten distinct thermal simulation results for a 10 ns SOT pulse of $\mu_0 H_L=17.5$ mT with a 20 ps rise time and 10 ns relaxation applied to a free ferromagnet with $\mu_0 H_{K,eff}=250$ mT. For all these simulations, the magnetization state toggles from $m_z=-1$ to $m_z=+1$ state and thus confirms the robustness of this switching mechanism to thermal noise. These room temperature simulations also validate the suggested SOT excited stable state threshold of $m_z=|0.2|$.

Figure 13A:
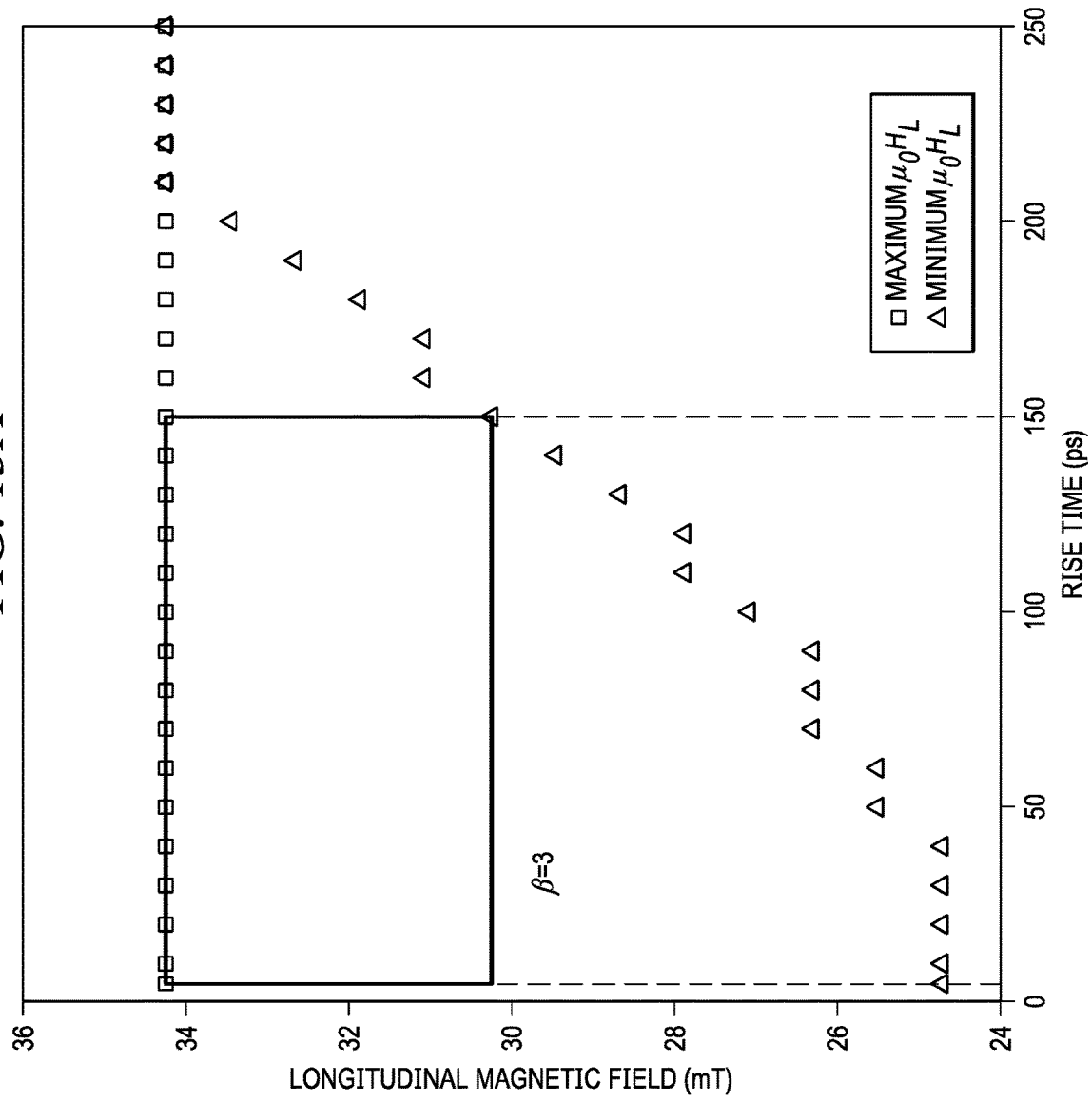
FIG. 13A depicts a graph illustrating rise time versus SOT field for $\beta=3$ in accordance with an illustrative embodiment.
Figure 13B:
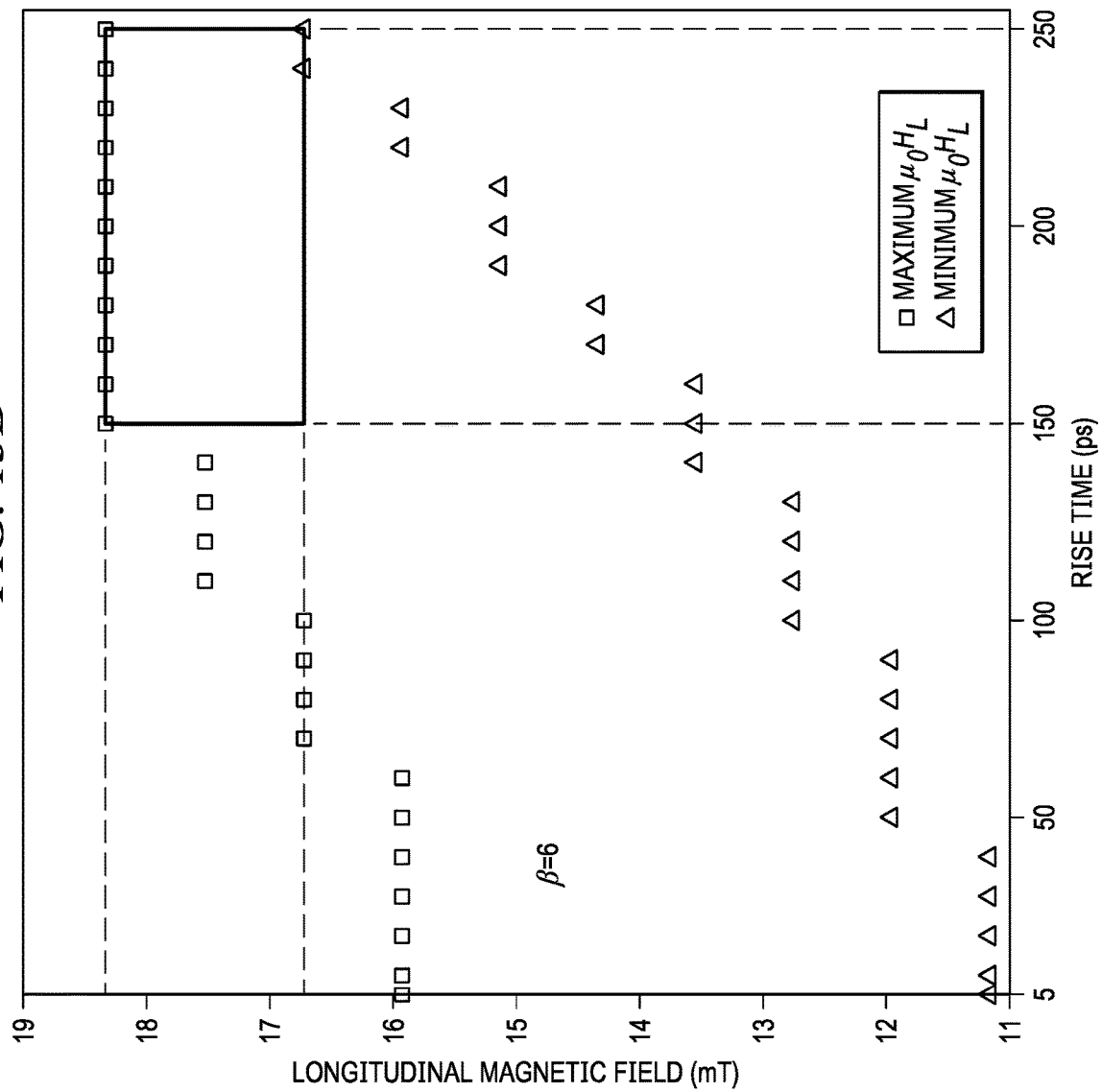
FIG. 13B depicts a graph illustrating rise time versus SOT field for $\beta=6$ in accordance with an illustrative embodiment.

FIGS. 13A and 13B depict an approach to selecting nominal SOT pulse characteristics that maximize the robustness of the toggle switching. FIG. 13A illustrates rise time versus SOT field for $\beta=3$. FIG. 13B illustrates rise time versus SOT field for $\beta=6$. As shown in the figures, bounding boxes are found with maximum height and width. The ideal nominal SOT current pulse magnitude and rise time are found near the center of these bounding boxes. In FIG. 13A, where only a half precession around the hard axis is possible, only the minimum SOT field is sensitive to rise time. However, in FIG. 13B, where both half and full precessions are possible, both the minimum and maximum boundary lines are sensitive to rise time. Even though both the maximum and minimum $\mu_0 H_L$ increase with $t_{rise}$, the toggle range and toggle range ration is smaller for $\beta=6$ as compared to $\beta=3$. It should be noted, however, that the use of a higher $\beta$ provides a larger input range for inputs with a long rise time. The boxes in the figures show promising ranges of proper toggle switching, which can be used as specifications for the driver circuit.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A magnetic tunnel junction, comprising:
an insulating tunnel barrier;
a fixed ferromagnet layer adjacent a first side of the insulating tunnel barrier, wherein the fixed ferromagnet layer comprises a fixed magnetization along an easy axis approximately normal to an interface between the fixed ferromagnet and the insulating tunnel barrier;
a free ferromagnet layer adjacent a second side of the insulating tunnel barrier opposite the fixed ferromagnet layer, wherein the free ferromagnet layer comprises a bistable magnetization along the easy axis, wherein the bistable magnetization can switch between a parallel state and an anti-parallel state with the fixed magnetization of the fixed ferromagnet layer; and
a heavy metal layer on a side of the free ferromagnet layer opposite the insulating tunnel barrier, the heavy metal layer configured to receive unidirectional electric current therethrough and substantially normal to the easy axis, wherein the unidirectional electrical current pulse applied through the heavy metal layer toggles the bistable magnetization of the free ferromagnet layer between the parallel and anti-parallel states regardless of which state the free ferromagnet layer is in upon application of the unidirectional electric current pulse.

2. The magnetic tunnel junction of claim 1, further comprising:
a first write terminal connected to the heavy metal layer;
a second write terminal connected to the heavy metal terminal, wherein the unidirectional electric current pulse flows between the first write terminal and the second write terminal; and
a read terminal connected to the fixed ferromagnet layer, wherein tunneling magnetoresistance to an electric current applied between the read terminal and the second write terminal corresponds to a resistance state of the magnetic tunnel junction.

3. The magnetic tunnel junction of claim 1, wherein a resistance state of the magnetic tunnel junction is respectively higher when the bistable magnetization of the free ferromagnet layer is in the anti-parallel state than when the bistable magnetization is in the parallel state.

4. The magnetic tunnel junction of claim 1, further comprising a compensating ferromagnet adjacent to the heavy metal.

5. The magnetic tunnel junction of claim 1, wherein the unidirectional electric current pulse exerts spin-orbit torque on the free ferromagnet layer.

6. The magnetic tunnel junction of claim 1, wherein the unidirectional electric current pulse comprises a pulse separation width of at least 0.5 ns.

7. The magnetic tunnel junction of claim 1, wherein the unidirectional electric current comprises a current density of at least 1e11 A/m^2 and not greater than 4e12 A/m^2.

8. The magnetic tunnel junction of claim 1, wherein the unidirectional electric current pulse comprises a pulse duration of at least 100 ps.

9. A memory device, comprising:
a magnetic tunnel junction, comprising:
a fixed ferromagnet with a fixed magnetization;
a free ferromagnet with a bistable magnetization, wherein the bistable magnetization of the free ferromagnet is in one of two states comprising: a parallel state wherein the bistable magnetization is approximately parallel to the fixed magnetization of the fixed ferromagnet and an anti-parallel state wherein the bistable magnetization is approximately anti-parallel to the fixed magnetization of the fixed ferromagnet;
an insulating tunnel barrier between the fixed ferromagnet and free ferromagnet;
a heavy metal layer adjacent the free ferromagnet;
a first write terminal connected to the heavy metal layer;
a second write terminal connected to the heavy metal layer; and
a read terminal connected to the fixed ferromagnet;
wherein the magnetic tunnel junction comprises perpendicular magnetic anisotropy (PMA) along an axis normal to an interface between the free ferromagnet and the insulating tunnel barrier; and
wherein the heavy metal layer is configured to receive unidirectional electric current therethrough from the first write terminal to second write terminal and substantially normal to the PMA, wherein the unidirectional electrical current pulse applied through the heavy metal layer toggles the bistable magnetization of the free ferromagnet layer between the parallel and anti-parallel states regardless of which state the free ferromagnet layer is in upon application of the unidirectional electric current pulse.

10. The memory device of claim 9, wherein a resistance state of the magnetic tunnel junction is respectively higher when the bistable magnetization of the free ferromagnet is in the anti-parallel state than when the bistable magnetization is in the parallel state.

11. The memory device of claim 10, wherein tunneling magnetoresistance to an electric current applied between the read terminal and the second write terminal corresponds to the resistance state of the magnetic tunnel junction.

12. The memory device of claim 9, wherein the unidirectional electric current pulse exerts spin-orbit torque on the free ferromagnet.

13. A method of toggle switching a magnetic tunnel junction that comprises a fixed ferromagnet layer, a free ferromagnet layer, an insulating tunnel barrier between the fixed ferromagnet layer and free ferromagnet layer, and a heavy metal layer adjacent the free ferromagnet layer, the method comprising:
applying a unidirectional electric current pulse between a first write terminal and a second write terminal connected to different sections of the heavy metal layer;
wherein the fixed ferromagnet layer comprises a fixed magnetization along an easy axis approximately normal to an interface between the fixed ferromagnet layer and the insulating tunnel barrier, and wherein the free ferromagnet layer comprises a bistable magnetization along the easy axis, wherein the bistable magnetization can switch between a parallel state and an anti-parallel state with the fixed magnetization of the fixed ferromagnet layer; and
wherein the unidirectional electric current pulse toggles the bistable magnetization of the free ferromagnet layer between the parallel and anti-parallel state, thereby switching an electrical resistance state of the magnetic tunnel junction regardless of which state the free ferromagnet layer is in upon application of the unidirectional electric current pulse.

14. The method of claim 13, wherein the resistance state of the magnetic tunnel junction is respectively higher when the bistable magnetization of the free ferromagnet layer is in the anti-parallel state than when the bistable magnetization is in the parallel state.

15. The method of claim 14, wherein the magnetic tunnel junction further comprises a read terminal connected to the fixed ferromagnetic layer, and wherein tunneling magnetoresistance to an electric current applied between the read terminal and the second write terminal corresponds to the resistance state of the magnetic tunnel junction.

16. The method of claim 15, further comprising:
   determining the current binary value of the magnetic tunnel junction; and
   applying the unidirectional electric current pulse between the first and second write terminals only when an input value differs from the current binary value of the magnetic tunnel junction.

17. The method of claim 13, wherein the unidirectional electric current pulse exerts spin-orbit torque on the free ferromagnet layer.

18. The magnetic tunnel junction of claim 1, wherein a toggle pulse is applied only when an incoming bit is different from a stored bit.

19. The memory device of claim 9, wherein a toggle pulse is applied only when an incoming bit is different from a stored bit.

20. The memory device of claim 9, further comprising a compensating ferromagnet adjacent to the heavy metal.

\* \* \* \* \*